United States Patent [19]
Komatsu et al.

[11] Patent Number: 6,161,163
[45] Date of Patent: Dec. 12, 2000

[54] METHOD OF WRITING, ERASING, AND CONTROLLING MEMORY FOR MEMORY DEVICE

[75] Inventors: Shinpei Komatsu; Yumi Ishii; Tomohiro Hayashi; Shogo Shibazaki, all of Yokohama; Hiroyuki Itoh, Kawasaki; Masaru Takehara, Yokohama, all of Japan

[73] Assignee: Fujitsu Limited, Kawasaki, Japan

[21] Appl. No.: 09/385,998

[22] Filed: Aug. 30, 1999

Related U.S. Application Data

[62] Division of application No. 08/912,692, Aug. 18, 1997, Pat. No. 5,983,312, which is a division of application No. 08/292,213, Aug. 19, 1994, Pat. No. 5,802,551.

[30] Foreign Application Priority Data

Oct. 1, 1993 [JP] Japan ................................. 5-246547

[51] Int. Cl.[7] ................................................. G06F 13/00
[52] U.S. Cl. .............................................................. 711/103
[58] Field of Search .................................... 711/103, 104, 711/118, 154

[56] References Cited

U.S. PATENT DOCUMENTS

| | | |
|---|---|---|
| 5,297,148 | 3/1994 | Harari et al. .............................. 714/710 |
| 5,341,339 | 8/1994 | Wells .................................. 365/185.11 |
| 5,357,475 | 10/1994 | Hasbun et al. ........................... 711/103 |
| 5,375,222 | 12/1994 | Robinson et al. ....................... 711/103 |
| 5,432,748 | 7/1995 | Hsu et al. ................................ 711/100 |
| 5,437,020 | 7/1995 | Wells et al. ................................. 714/6 |
| 5,459,850 | 10/1995 | Clay et al. .............................. 711/171 |
| 5,473,753 | 12/1995 | Wells et al. ................................. 714/5 |
| 5,479,633 | 12/1995 | Wells et al. .............................. 711/103 |

FOREIGN PATENT DOCUMENTS

| | | |
|---|---|---|
| 62-283496 | 12/1987 | Japan . |
| 62-283497 | 12/1987 | Japan . |

*Primary Examiner*—David L. Robertson
*Attorney, Agent, or Firm*—Staas & Halsey LLP

[57] ABSTRACT

Data transferred from a host computer to a memory device is written into sectors whose addresses in a memory area are decoded by a decode table. Old data to be updated by the above data is erased or marked with erase flags. At a predetermined point of time, in order to create free areas, necessary data is evacuated to a primary memory media and unnecessary data indicated by erase flags is erased by a unit of predetermined memory size. Part of the memory media which has become defective is marked with a defect flag, and is replaced by an alternate area. In doing so, the decode table is rewritten to rearrange the memory area.

3 Claims, 45 Drawing Sheets

FIG.10C

| BLOCK1 | BLOCK2 | BLOCK3 | BLOCK4 | BLOCK5 | BLOCK6 |
|---|---|---|---|---|---|
| A | G | K | | | |
| B | H | L | | | |
| ERASABLE | I | M | | | |
| ERASABLE | C | N | | | |
| E | D | O | | | |
| F | J | | | | |

FIG.10D

| BLOCK1 | BLOCK2 | BLOCK3 | BLOCK4 | BLOCK5 | BLOCK6 |
|---|---|---|---|---|---|
| A | G | ERASABLE | I | | |
| B | ERASABLE | ERASABLE | J | | |
| ERASABLE | ERASABLE | ERASABLE | K | | |
| ERASABLE | C | ERASABLE | L | | |
| E | D | O | M | | |
| F | ERASABLE | H | N | | |

FIG.10G

| BLOCK1 | BLOCK2 | BLOCK3 | BLOCK4 | BLOCK5 | BLOCK6 |
|---|---|---|---|---|---|
| A | G | | | O | ERASABLE |
| B | ERASABLE | | | ERASABLE | J |
| ERASABLE | ERASABLE | | | K | L |
| ERASABLE | ERASABLE | | | M | N |
| E | ERASABLE | | | C | H |
| F | ERASABLE | | | D | I |

FIG.10H

| BLOCK1 | BLOCK2 | BLOCK3 | BLOCK4 | BLOCK5 | BLOCK6 |
|---|---|---|---|---|---|
| A | | G | J | O | |
| B | | L | N | ERASABLE | |
| ERASABLE | | H | I | K | |
| ERASABLE | | | | M | |
| E | | | | C | |
| F | | | | D | |

FIG.10I

| BLOCK1 | BLOCK2 | BLOCK3 | BLOCK4 | BLOCK5 | BLOCK6 |
|---|---|---|---|---|---|
| A | | G | ERASABLE | O | |
| B | | L | N | ERASABLE | |
| ERASABLE | | H | I | K | |
| ERASABLE | | J | | M | |
| E | | | | C | |
| F | | | | D | |

FIG.10J

| BLOCK1 | BLOCK2 | BLOCK3 | BLOCK4 | BLOCK5 | BLOCK6 |
|---|---|---|---|---|---|
| A | | ERASABLE | ERASABLE | O | |
| B | | L | N | ERASABLE | |
| ERASABLE | | H | I | K | |
| ERASABLE | | J | G | M | |
| ERASABLE | | E | | C | |
| ERASABLE | | F | | D | |

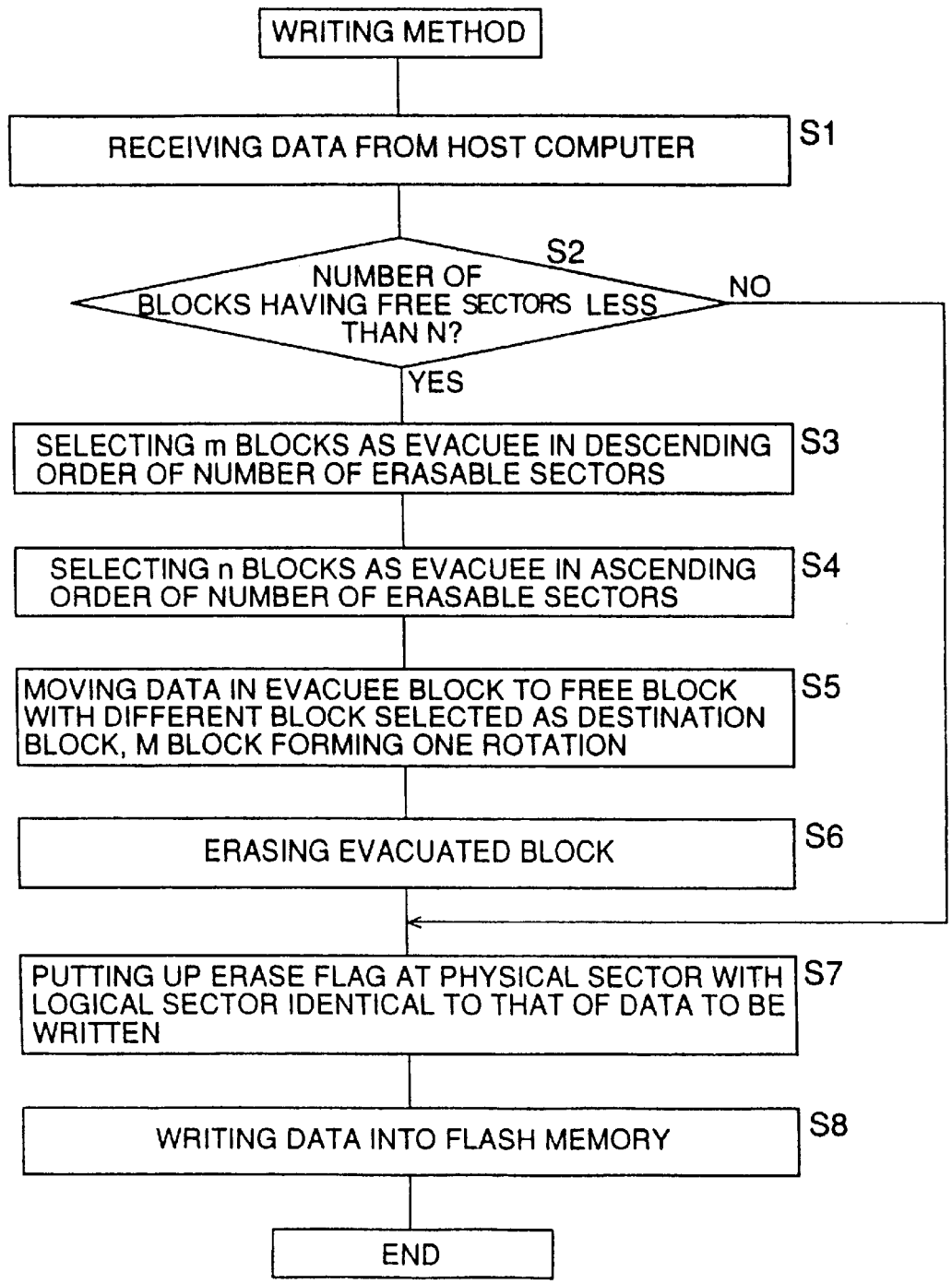

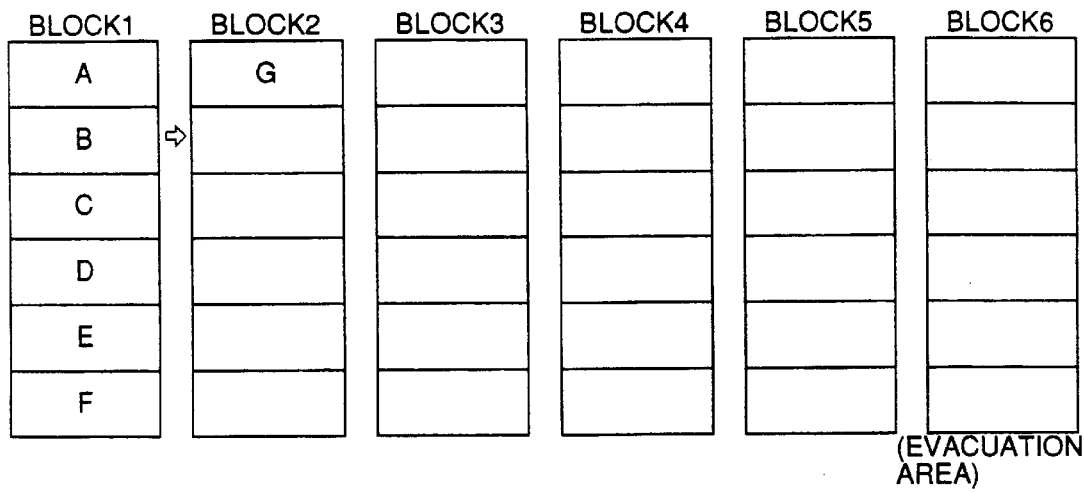
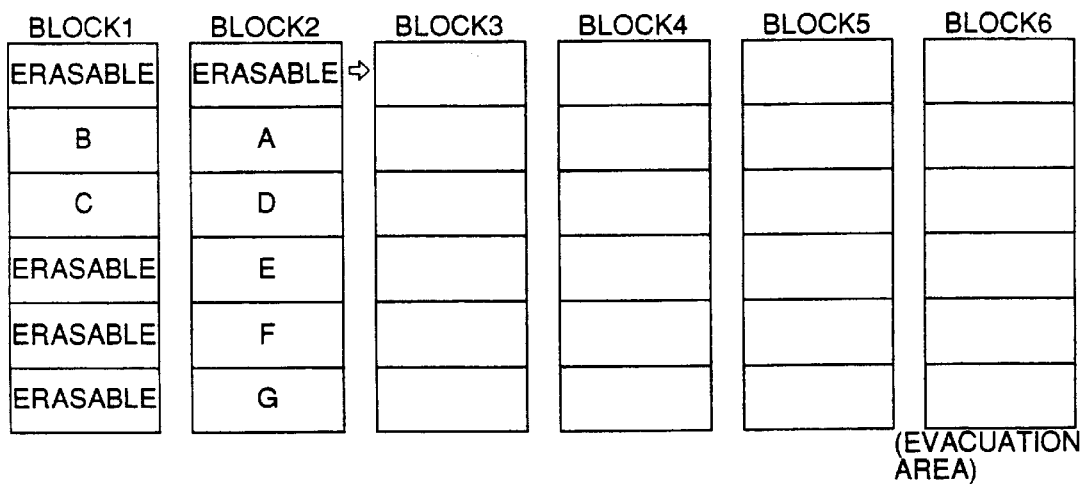
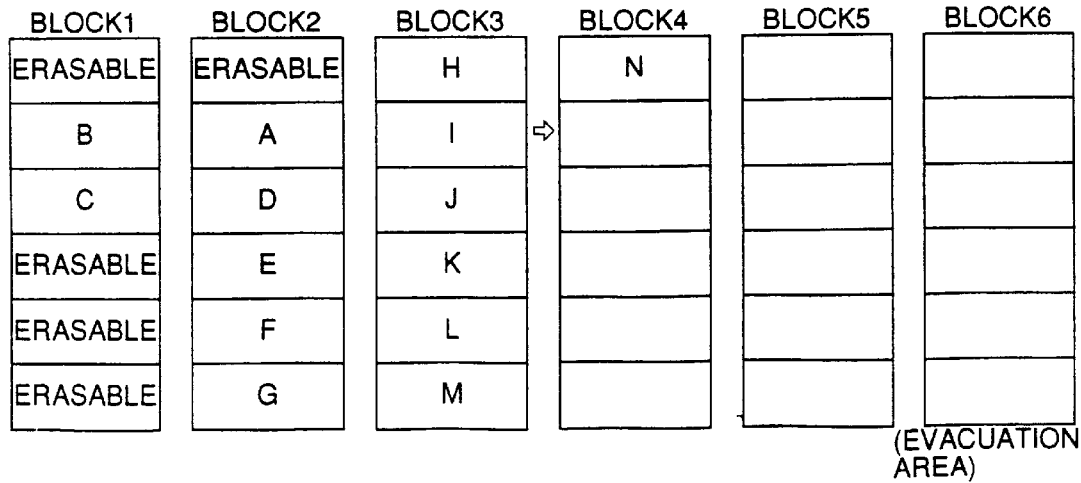

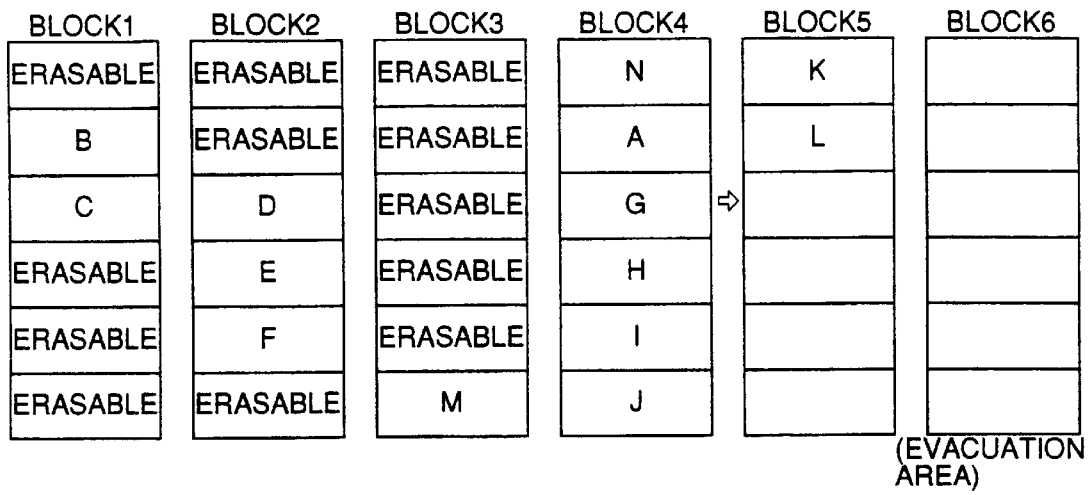
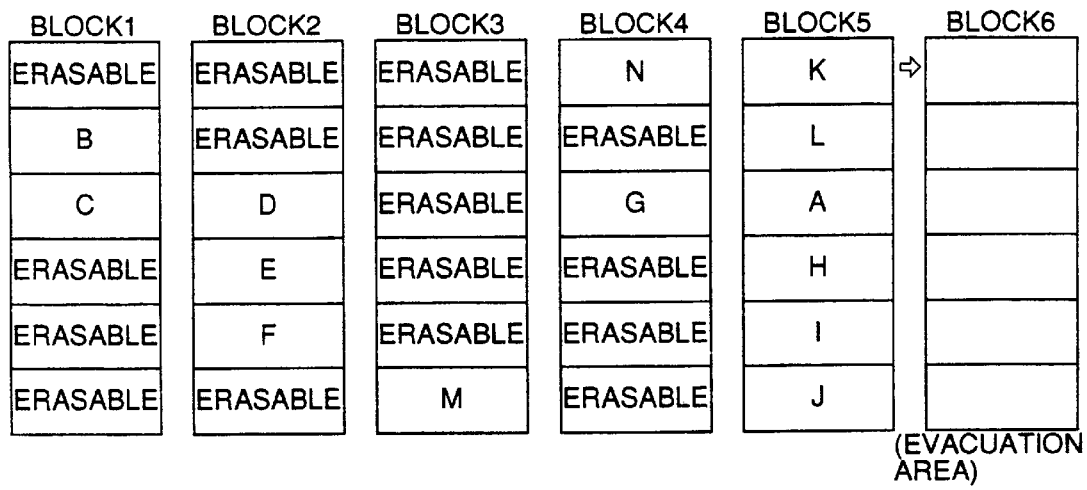
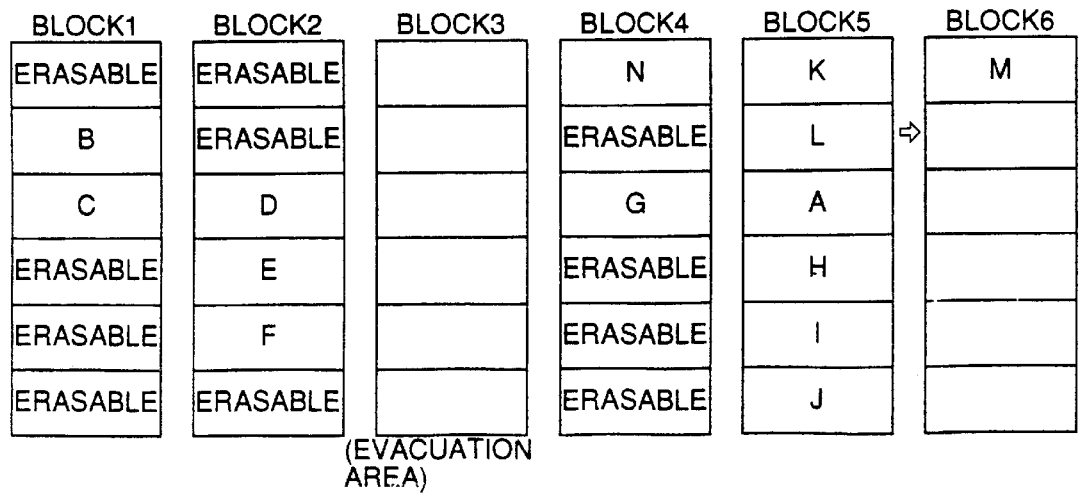

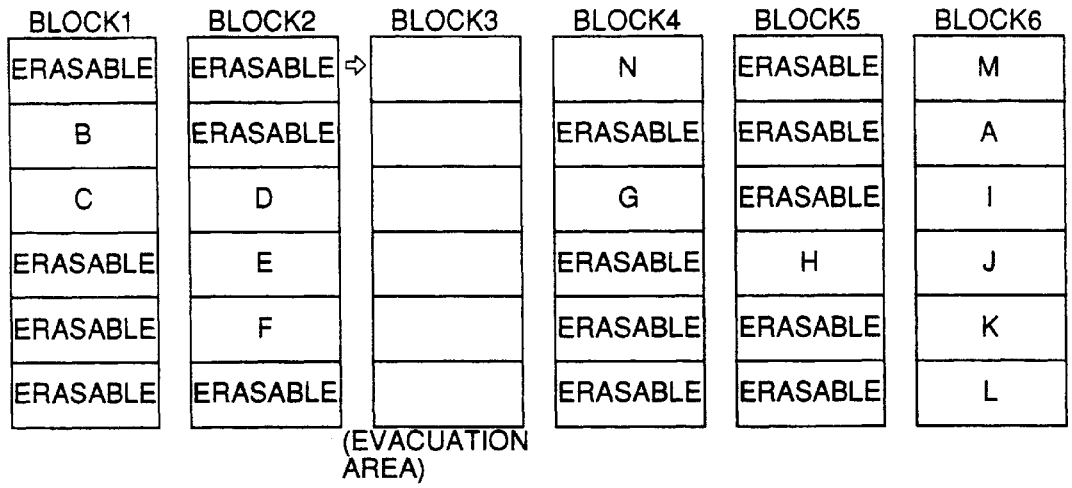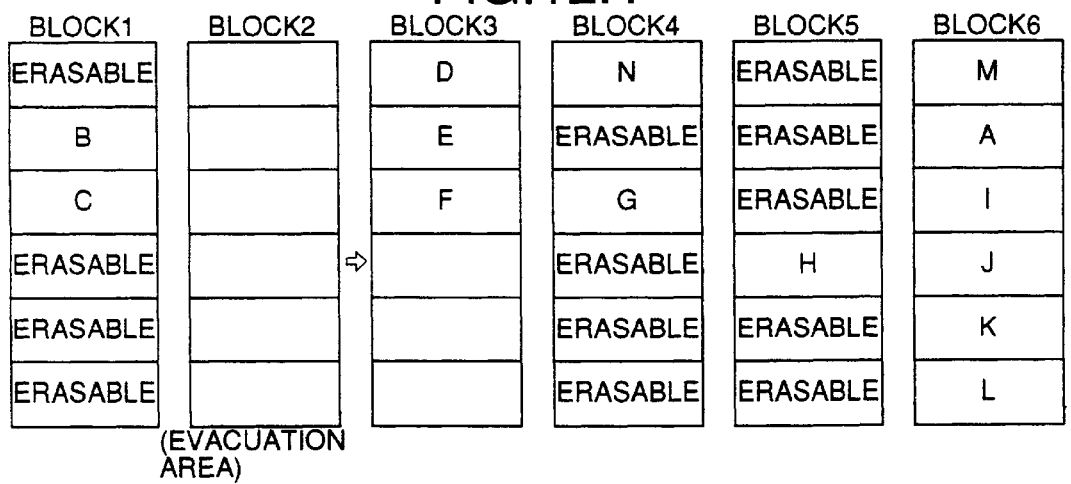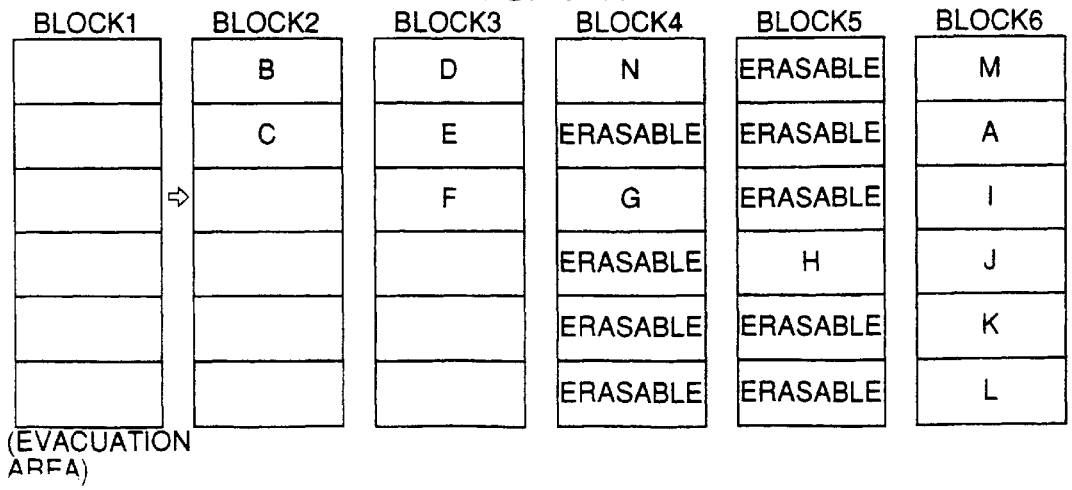

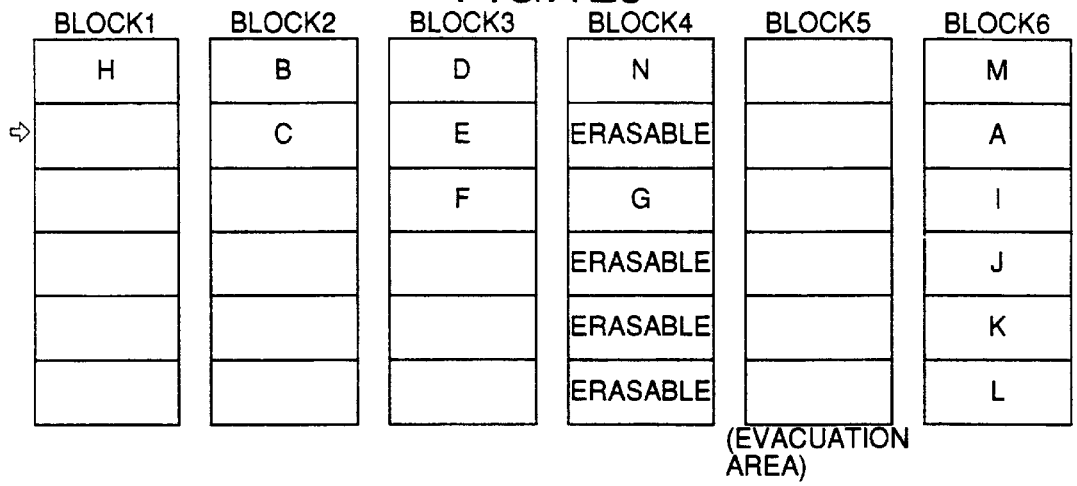
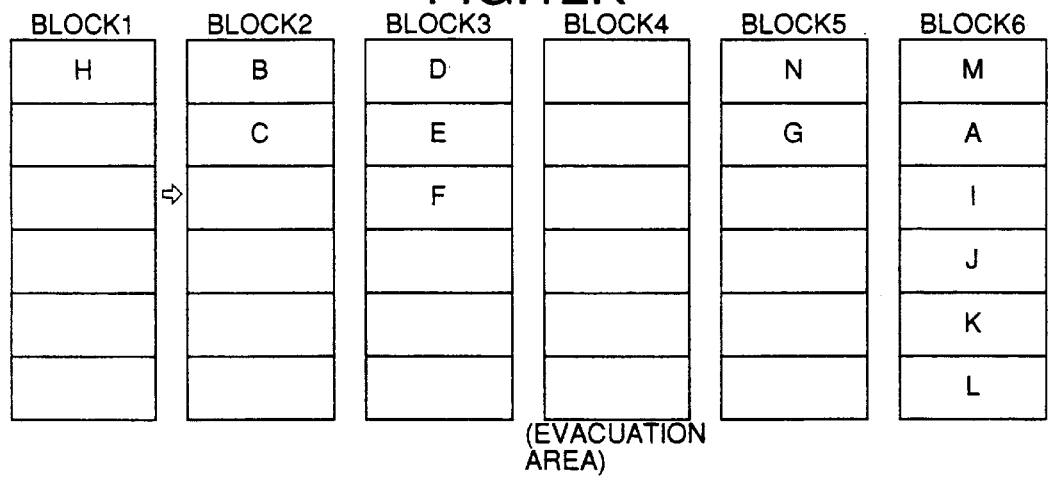
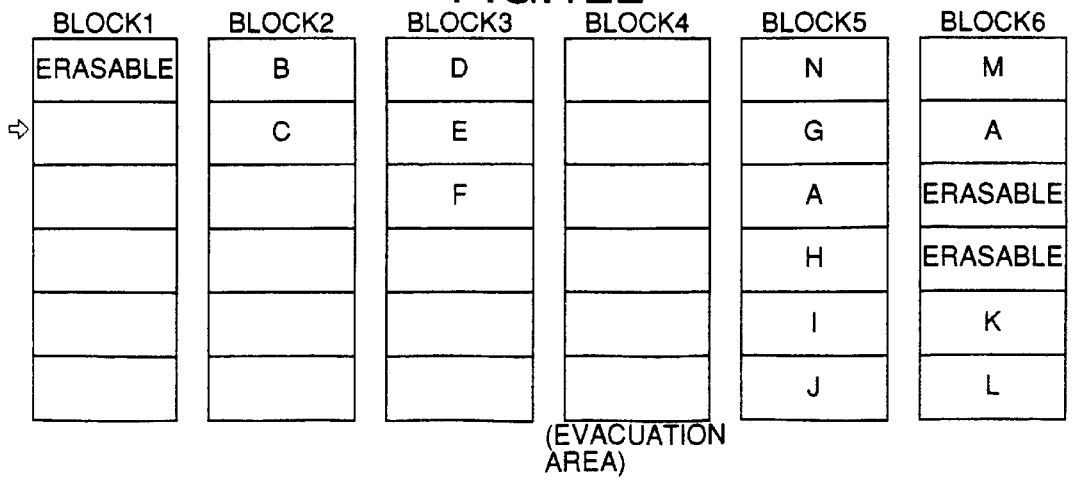

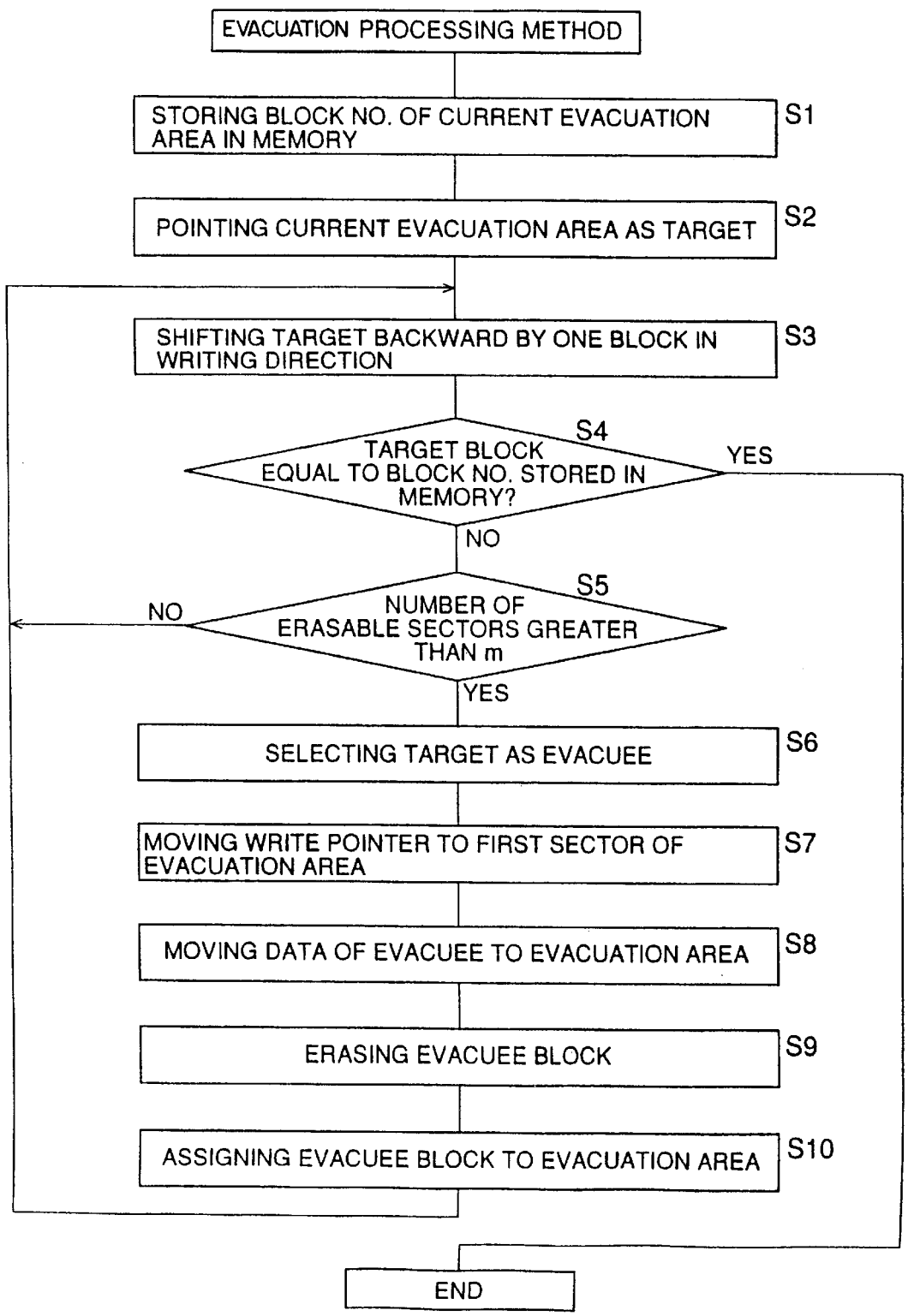

FIG.14A

| BLOCK0 (BACKUP AREA) | BLOCK1 | BLOCK2 | BLOCK3 | BLOCK4 | BLOCK5 | BLOCK6 (EVACUATION AREA) |
|---|---|---|---|---|---|---|
|  | A | G |  |  |  |  |
|  | B |  |  |  |  |  |
|  | C |  |  |  |  |  |
|  | D |  |  |  |  |  |
|  | E |  |  |  |  |  |
|  | F |  |  |  |  |  |

FIG.14B

| BLOCK0 (BACKUP AREA) | BLOCK1 | BLOCK2 | BLOCK3 | BLOCK4 | BLOCK5 | BLOCK6 (EVACUATION AREA) |
|---|---|---|---|---|---|---|
|  | ERASABLE | ERASABLE |  |  |  |  |
|  | B | A |  |  |  |  |
|  | C | D |  |  |  |  |
|  | ERASABLE | E |  |  |  |  |
|  | ERASABLE | F |  |  |  |  |
|  | ERASABLE | G |  |  |  |  |

FIG.14C

| BLOCK0 (BACKUP AREA) | BLOCK1 | BLOCK2 | BLOCK3 | BLOCK4 | BLOCK5 | BLOCK6 (EVACUATION AREA) |
|---|---|---|---|---|---|---|
|  | ERASABLE | ERASABLE | H | N |  |  |
|  | B | A | I |  |  |  |
|  | C | D | J |  |  |  |
|  | ERASABLE | E | K |  |  |  |
|  | ERASABLE | F | L |  |  |  |
|  | ERASABLE | G | M |  |  |  |

FIG.14D

| BLOCK0 | BLOCK1 | BLOCK2 | BLOCK3 | BLOCK4 | BLOCK5 | BLOCK6 |
|---|---|---|---|---|---|---|
| | ERASABLE | ERASABLE | ERASABLE | N | K | |
| | B | ERASABLE | ERASABLE | A | L | |
| | C | D | ERASABLE | G | | |
| | ERASABLE | E | ERASABLE | H | | |
| | ERASABLE | F | ERASABLE | I | | |
| | ERASABLE | G | M | J | | |
| (BACKUP AREA) | | | | | | (EVACUATION AREA) |

FIG.14E

| BLOCK0 | BLOCK1 | BLOCK2 | BLOCK3 | BLOCK4 | BLOCK5 | BLOCK6 |
|---|---|---|---|---|---|---|
| | ERASABLE | ERASABLE | ERASABLE | N | K | |
| | B | ERASABLE | ERASABLE | ERASABLE | L | |
| | C | D | ERASABLE | G | A | |
| | ERASABLE | E | ERASABLE | ERASABLE | H | |
| | ERASABLE | F | ERASABLE | ERASABLE | I | |
| | ERASABLE | ERASABLE | M | ERASABLE | J | |
| (BACKUP AREA) | | | | | | (EVACUATION AREA) |

FIG.14F

| BLOCK0 | BLOCK1 | BLOCK2 | BLOCK3 | BLOCK4 | BLOCK5 | BLOCK6 |
|---|---|---|---|---|---|---|
| | ERASABLE | ERASABLE | | N | K | M |
| | B | ERASABLE | | ERASABLE | L | |
| | C | D | | G | A | |
| | ERASABLE | E | | ERASABLE | H | |
| | ERASABLE | F | | ERASABLE | I | |
| | ERASABLE | ERASABLE | | ERASABLE | J | |
| (BACKUP AREA) | | | (EVACUATION AREA) | | | |

FIG.14G

| BLOCK0 | BLOCK1 | BLOCK2 | BLOCK3 | BLOCK4 | BLOCK5 | BLOCK6 |
|---|---|---|---|---|---|---|
| | ERASABLE | ERASABLE | | N | ERASABLE | M |
| | B | ERASABLE | | ERASABLE | ERASABLE | A |
| | C | D | | G | ERASABLE | I |
| | ERASABLE | E | | ERASABLE | H | J |
| | ERASABLE | F | | ERASABLE | ERASABLE | K |
| | ERASABLE | ERASABLE | | ERASABLE | ERASABLE | L |
| (BACKUP AREA) | | | (EVACUATION AREA) | | | |

FIG.14H

| BLOCK0 | BLOCK1 | BLOCK2 | BLOCK3 | BLOCK4 | BLOCK5 | BLOCK6 |
|---|---|---|---|---|---|---|
| | ERASABLE | ERASABLE | H | N | | M |
| | B | ERASABLE | | ERASABLE | | A |
| | C | D | | G | | I |
| | ERASABLE | E | | ERASABLE | | J |
| | ERASABLE | F | | ERASABLE | | K |
| | ERASABLE | ERASABLE | | ERASABLE | | L |
| (BACKUP AREA) | | | | | (EVACUATION AREA) | |

FIG.14I

| BLOCK0 | BLOCK1 | BLOCK2 | BLOCK3 | BLOCK4 | BLOCK5 | BLOCK6 |
|---|---|---|---|---|---|---|
| B |  | ERASABLE | H | N |  | M |
| C |  | ERASABLE |  | ERASABLE |  | A |
|  |  | D |  | G |  | I |
|  |  | E |  | ERASABLE |  | J |
|  |  | F |  | ERASABLE |  | K |
|  |  | ERASABLE |  | ERASABLE |  | L |
| (BACKUP AREA) | (EVACUATION AREA) |  |  |  | (UNABLE TO BE USED) |  |

FIG.14J

| BLOCK0 | BLOCK1 | BLOCK2 | BLOCK3 | BLOCK4 | BLOCK5 | BLOCK6 |
|---|---|---|---|---|---|---|
|  |  | ERASABLE | H | N |  | M |
|  |  | ERASABLE | B | ERASABLE |  | A |
|  |  | D | C | G |  | I |
|  |  | E |  | ERASABLE |  | J |
|  |  | F |  | ERASABLE |  | K |
|  |  | ERASABLE |  | ERASABLE |  | L |
| (BACKUP AREA) | (EVACUATION AREA) |  |  |  | (UNABLE TO BE USED) |  |

FIG.14K

| BLOCK0 | BLOCK1 | BLOCK2 | BLOCK3 | BLOCK4 | BLOCK5 | BLOCK6 |
|---|---|---|---|---|---|---|
|  |  | ERASABLE | H | ERASABLE |  | ERASABLE |
|  |  | ERASABLE | B | ERASABLE |  | ERASABLE |
|  |  | D | C | G |  | I |
|  |  | E | A | ERASABLE |  | J |
|  |  | F | M | ERASABLE |  | K |
|  |  | ERASABLE | N | ERASABLE |  | L |
| (BACKUP AREA) | (EVACUATION AREA) |  |  |  | (UNABLE TO BE USED) |  |

FIG.14L

| BLOCK0 | BLOCK1 | BLOCK2 | BLOCK3 | BLOCK4 | BLOCK5 | BLOCK6 |
|---|---|---|---|---|---|---|
|  | G | ERASABLE | H |  |  | ERASABLE |
|  |  | ERASABLE | B |  |  | ERASABLE |
|  |  | D | C |  |  | I |
|  |  | E | A |  |  | J |
|  |  | F | M |  |  | K |
|  |  | ERASABLE | N |  |  | L |
| (BACKUP AREA) |  |  | (EVACUATION AREA) | (UNABLE TO BE USED) |  |  |

FIG.14M

| BLOCK0 | BLOCK1 | BLOCK2 | BLOCK3 | BLOCK4 | BLOCK5 | BLOCK6 |
|---|---|---|---|---|---|---|
|  | ERASABLE | ERASABLE | ERASABLE |  |  | ERASABLE |
|  | A | ERASABLE | B |  |  | ERASABLE |
|  | G | D | C |  |  | I |
|  | H | E | ERASABLE |  |  | J |
|  | O | F | M |  |  | K |
|  | P | ERASABLE | N |  |  | L |
| (BACKUP AREA) |  |  | (EVACUATION AREA) | (UNABLE TO BE USED) |  |  |

FIG.14N

| BLOCK0 | BLOCK1 | BLOCK2 | BLOCK3 | BLOCK4 | BLOCK5 | BLOCK6 |
|---|---|---|---|---|---|---|
|  | ERASABLE |  | ERASABLE | D |  | ERASABLE |
|  | A |  | B | E |  | ERASABLE |
|  | G |  | C | F |  | I |
|  | H |  | ERASABLE |  |  | J |
|  | O |  | M |  |  | K |
|  | P |  | N |  |  | L |
| (BACKUP AREA) |  | (EVACUATION AREA) |  |  | (UNABLE TO BE USED) |  |

FIG.14O

| BLOCK0 | BLOCK1 | BLOCK2 | BLOCK3 | BLOCK4 | BLOCK5 | BLOCK6 |
|---|---|---|---|---|---|---|
| B | ERASABLE | | | D | | ERASABLE |
| C | A | | | E | | ERASABLE |
| M | G | | | F | | I |
| N | H | | | | | J |
| | O | | | | | K |
| | P | | | | | L |
| (BACKUP AREA) | | (UNABLE TO BE USED) | (EVACUATION AREA) | | (UNABLE TO BE USED) | |

FIG.14P

| BLOCK0 | BLOCK1 | BLOCK2 | BLOCK3 | BLOCK4 | BLOCK5 | BLOCK6 |
|---|---|---|---|---|---|---|
| B | ERASABLE | | K | D | | |
| C | A | | L | E | | |
| M | G | | | F | | |
| N | H | | | | | |
| I | O | | | | | |
| J | P | | | | | |
| (BACKUP AREA) | | (UNABLE TO BE USED) | | | (UNABLE TO BE USED) | (EVACUATION AREA) |

FIG.14Q

| BLOCK0 | BLOCK1 | BLOCK2 | BLOCK3 | BLOCK4 | BLOCK5 | BLOCK6 |
|---|---|---|---|---|---|---|
| ERASABLE | ERASABLE |  | K | D |  |  |
| ERASABLE | A |  | L | E |  |  |
| ERASABLE | G |  | B | F |  |  |
| ERASABLE | H |  | C |  |  |  |
|  | O |  | M |  |  |  |
|  | P |  | N |  |  |  |
| (BACKUP AREA) |  | (UNABLE TO BE USED) |  |  | (UNABLE TO BE USED) | (EVACUATION AREA) |

FIG.14R

| BLOCK0 | BLOCK1 | BLOCK2 | BLOCK3 | BLOCK4 | BLOCK5 | BLOCK6 |
|---|---|---|---|---|---|---|
|  | ERASABLE |  | K | D |  |  |
|  | A |  | L | E |  |  |
|  | G |  | B | F |  |  |
|  | H |  | C | I |  |  |
|  | O |  | M | J |  |  |
|  | P |  | N |  |  |  |
| (BACKUP AREA) |  | (UNABLE TO BE USED) |  |  | (UNABLE TO BE USED) | (EVACUATION AREA) |

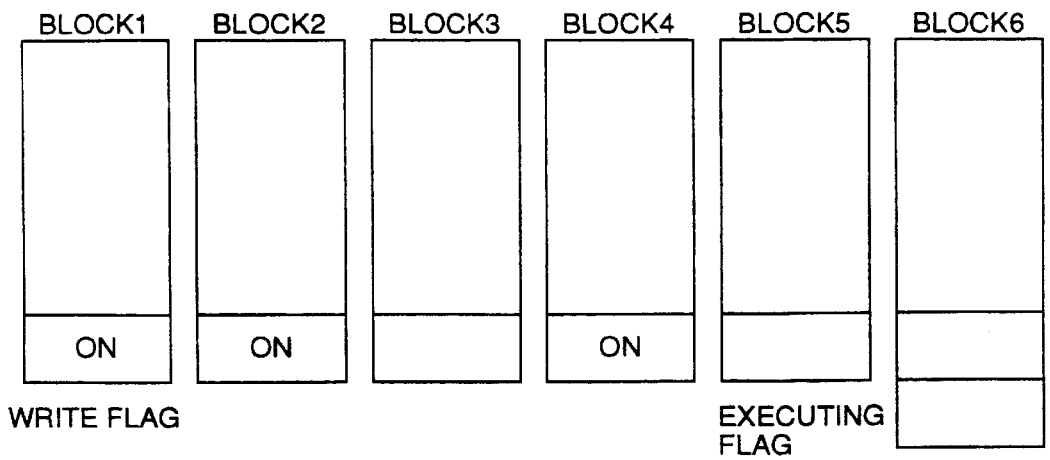
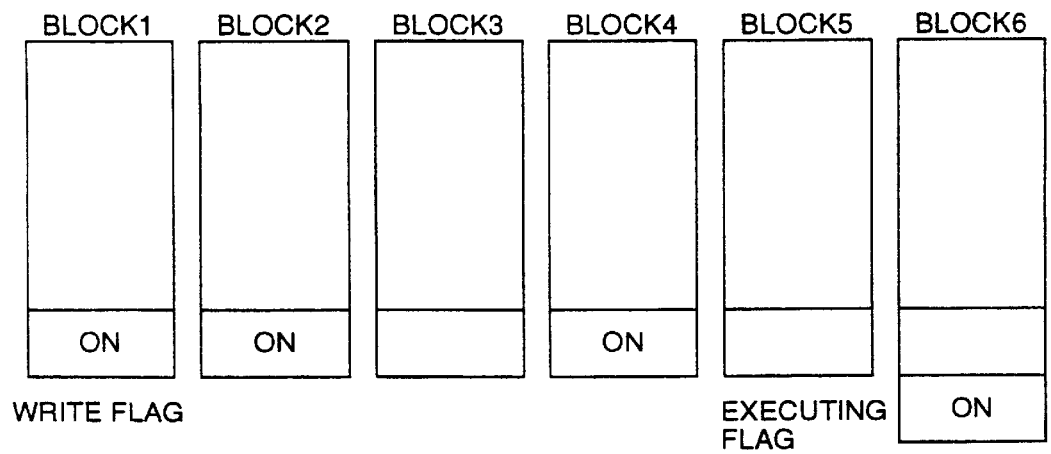
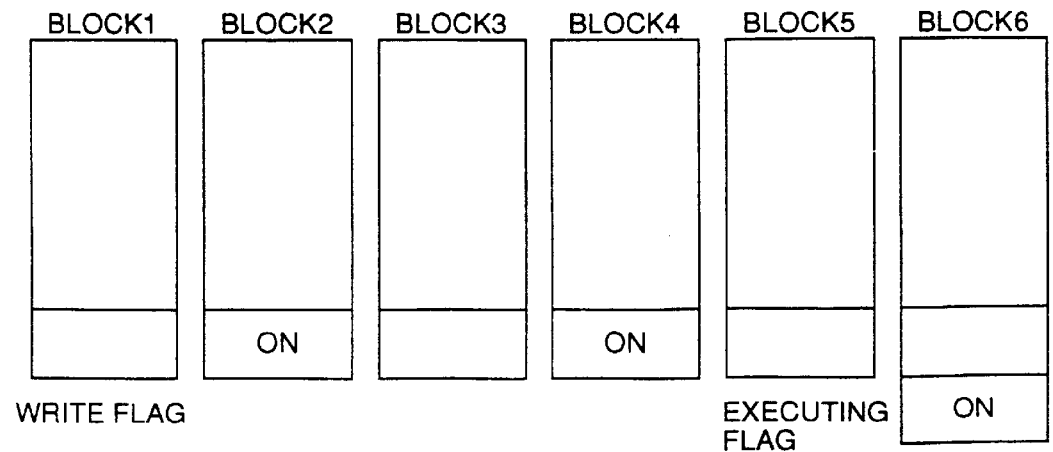

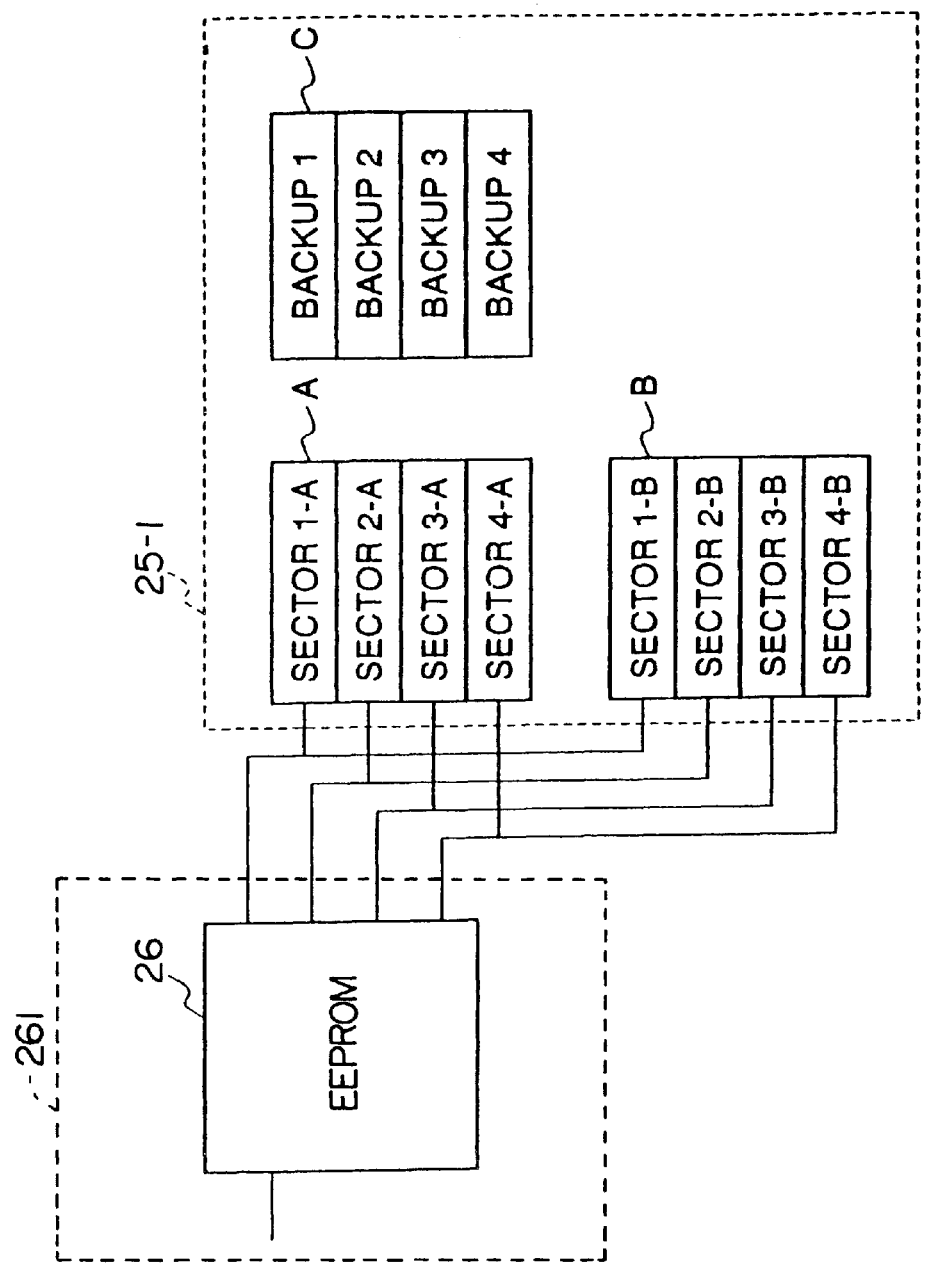

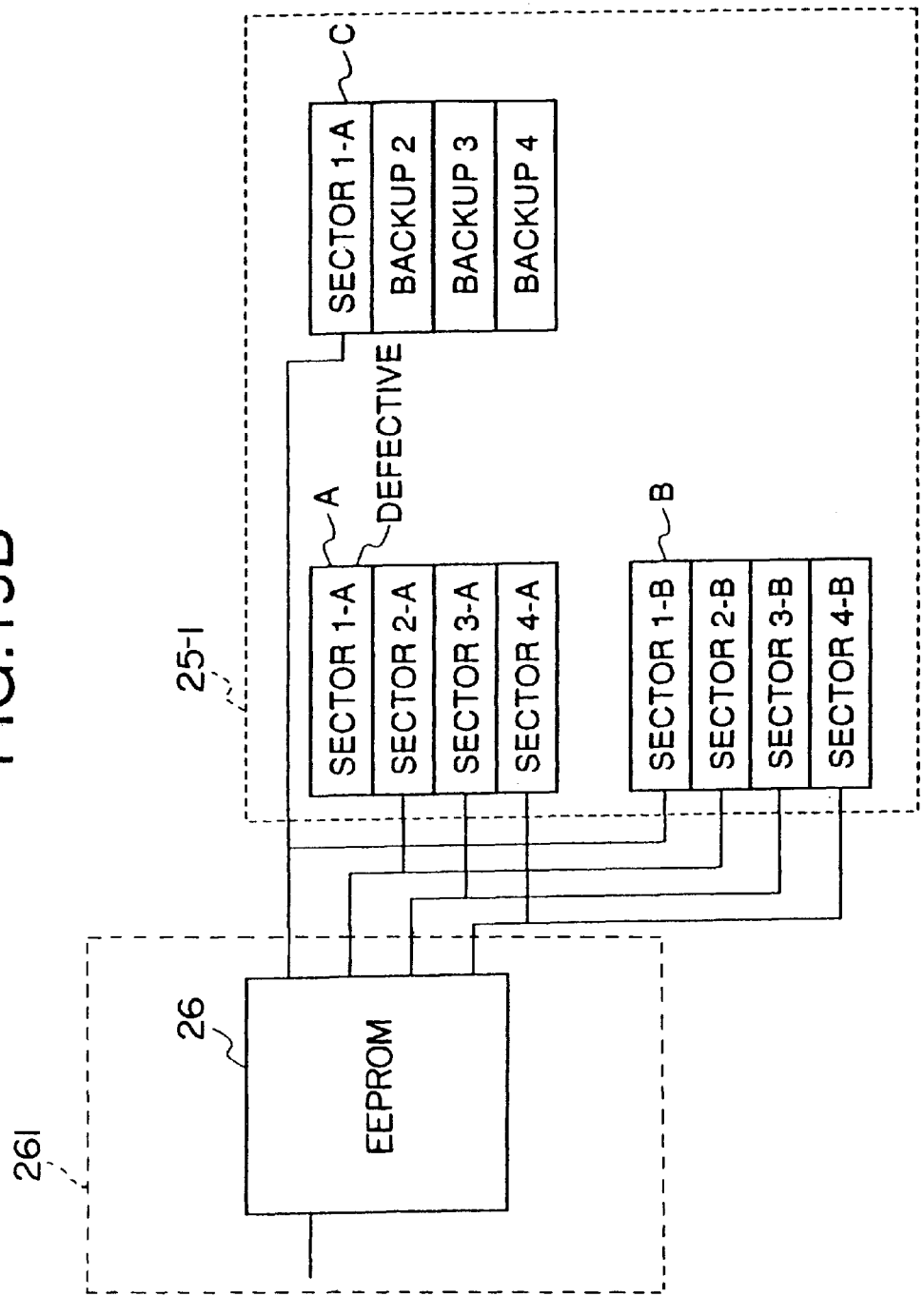

METHOD OF WRITING, ERASING, AND CONTROLLING MEMORY FOR MEMORY DEVICE

This application is a divisional of application Ser. No. 08/912,692, filed Aug. 18, 1997, now U.S. Pat. No. 5,983,312, which is a divisional of application Ser. No. 08/292,213, filed Aug. 19, 1994, now U.S. Pat. No. 5,802,551.

BACKGROUND OF THE INVENTION

1. Field of the Invention

The present invention relates to a method of controlling the writing and erasing of information in flash memories and the like used as an external storage device for personal computers. This type of memory is incapable of having information written over existing information.

2. Description of the Prior Art

In recent years, there has been wide attention on external storage devices which use flash memory. The flash memory does not require a backup power supply because of its non-volatile characteristic, can be rewritten electrically, and, also, is inexpensive. However, the flash memory has shortcomings as follows.

First, it is impossible to write information over existing information. Also, it is impossible to erase information by the unit of byte, but possible by the unit of sector, block, or chip. Thus, a rewrite can not be done byte by byte as in the conventional so that the rewriting speed as well as the erasing speed is relatively slow compared to the reading speed.

Second, there is a limit in the number of erasures that the flash memory can tolerate, and a typical flash memory can not be used after a hundred thousand to one million erasures. Thus, areas which experience a larger number of erasures become defective faster than other areas so that the total area available for storing information decreases unless the number of erasures are roughly averaged across all the sectors or all the blocks, whichever is used as the unit of erasing.

Since the flash memory has shortcomings as listed above, various counter measures should be taken in using the flash memory, which range from preparing an evacuation area and evacuating data at the time of rewriting, providing a control table for controlling the writing and erasing of information, to preparing a way to save the situation when defective sectors or defective blocks are generated.

As described above, the flash memory has such advantages as a non-volatile characteristic and electrical rewrite capability, but also has many inadequacies as well, so that those inadequacies must be surmounted before using it for a practical purpose.

Accordingly, there is a need in the flash memory field for a method of writing, erasing, and controlling a memory so that those shortcomings are obviated to facilitate use of flash memory for practical purposes.

SUMMARY OF THE INVENTION

Accordingly, it is a general object of the present invention to provide a method of writing, erasing, and controlling a flash memory, which method satisfies the need described above.

It is another and more specific object of the present invention to provide an efficient method of writing, erasing, and controlling a memory for a memory device whose memory can not write information over existing information and can not erase information by the unit of byte.

It is yet another object of the present invention to provide a method of writing, erasing, and controlling the memory, which method can average the numbers of erasures all over the memory area.

In order to achieve those objects, a method of writing and erasing data in a memory device with a memory area having a plurality of blocks each with a plurality of sectors, with the memory device erasing data by the unit of one block, comprises the steps of selecting a first predetermined number of blocks from a top of a first list in which the blocks are ranked in a descending order of a number of necessary sectors in each of the blocks, selecting a second predetermined number of blocks from a top of a second list in which the blocks are ranked in a ascending order of a number of necessary sectors in each of the blocks, and evacuating the necessary sectors from the first predetermined number of blocks and a second predetermined number of blocks to other blocks which have free sectors.

It is still another object of the present invention to provide a method of writing, erasing, and controlling the memory, which method can increase its writing speed.

In order to achieve this object, a management method of writing data in a memory device with a memory area having a plurality of sectors unable to be overwritten, with a memory device erasing data by the unit of one sector, comprises the steps of providing at least two sectors for each sector number, writing data into one of the two sectors, the noted one being a free, and erasing data in the other sector of the two sectors simultaneously with the step of writing data, if there is data in the other sector.

It is a further object of the present invention to provide a method of writing, erasing, and controlling the memory, by a method which can increase the reliability of the memory management.

It is a yet further object of the present invention to provide a method of writing, erasing, and controlling the memory, by a method which can provide a counter measure when defective areas are generated.

In order to achieve those objects, a method of managing a memory device with a memory area having a possibility that part of the memory area is destroyed, and having a decoder able to be rewritten for indicating locations where data is stored in the memory area, comprises the steps of arranging two decoders in a series to form the decoder, and rewriting at least one of the two decoders when part of the memory area or part of the two decoders is destroyed, so that this part of the memory area or this part of the two decoders is not accessed.

Other objects and further features of the present invention will be apparent from the following detailed description when read in conjunction with the accompanying drawings.

BRIEF DESCRIPTION OF THE DRAWINGS

FIGS. 10A to 10J are illustrative drawings showing an embodiment of averaging the numbers of erasures according to the present invention FIG. 11 is a flow chart showing a process of averaging the numbers of erasures;

FIGS. 12A to 12L are illustrative drawings showing an embodiment of erasing unnecessary data according to the present invention;

FIG. 13 is a flow chart showing a process of erasing unnecessary data;

FIGS. 14A to 14R are illustrative drawings showing an embodiment of creating a free area according to the present invention;

FIGS. 19A and 19B are illustrative drawings showing a first embodiment of enhancing a writing speed according to the present invention;

DESCRIPTION OF THE PREFERRED EMBODIMENTS

In the rest of the description, the following topics will be described in the following order: A. Structure of System Serving as Basis for Present Invention, B. Writing/Erasing Process for Data Evacuation and Free Area Creation, C. Enhancement of Erasing Process and D. Enhancement of Writing Speed and Allocation of Backup Areas in Case of Defect Sectors, A. Structure of System Serving as Basis for Present Invention FIG. 1 is a block diagram showing the structure of a memory device 20 which uses flash memories and serves as a basis for the present invention.

Figure 1:
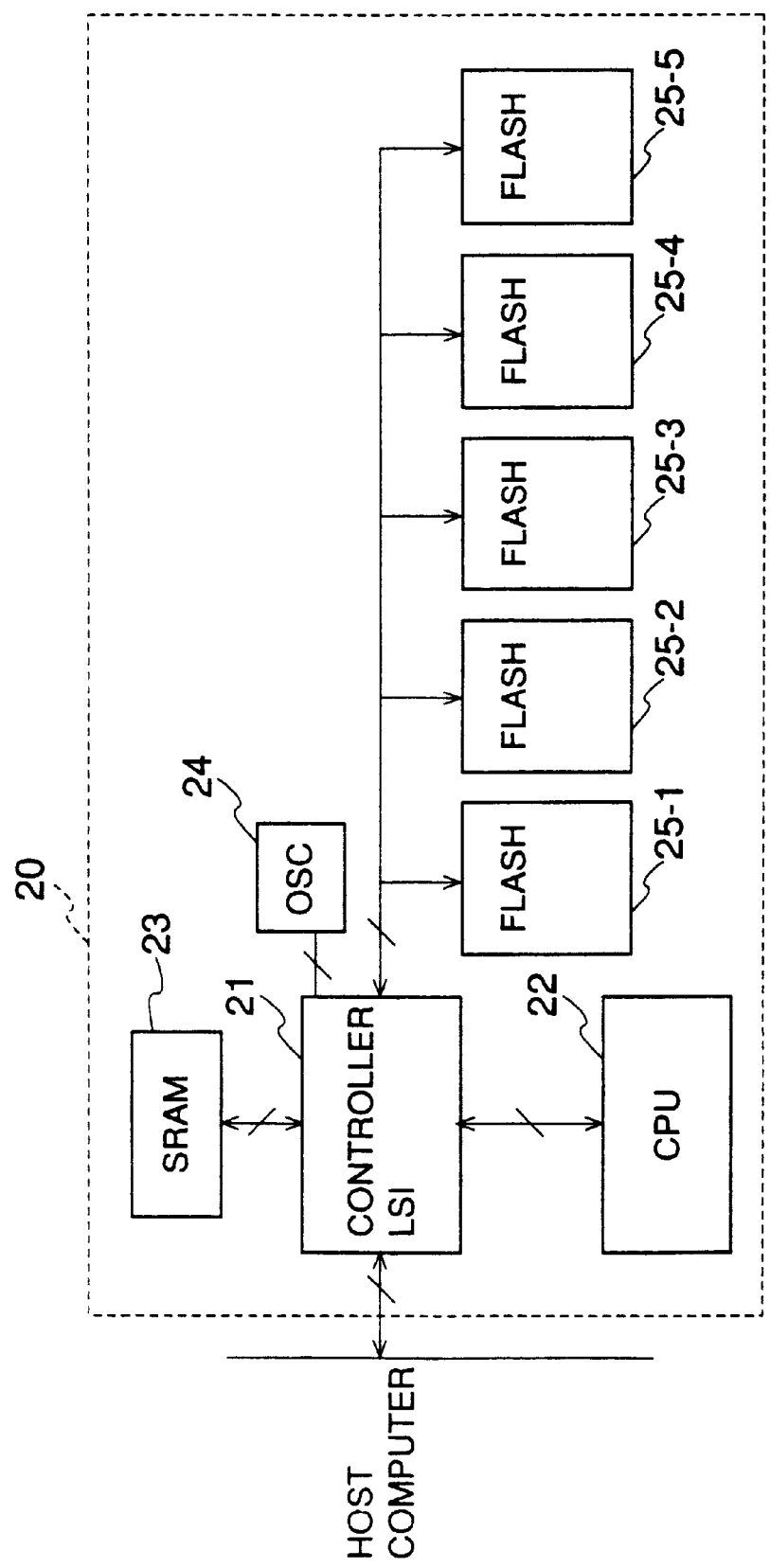
FIG. 1 is a block diagram showing a structure of a memory device serving as a basis for the present invention.

In FIG. 1, a memory device 20 such as a memory card comprises a control LSI (Large Scale Integrated Circuit) 21, a processor 22 for controlling the rewriting and erasing of data, a SRAM (Static Random Access Memory) 23 for storing various types of tables and serving as a data evacuation buffer at the time of writing data, a clock generator 24, and flash memories 25-1 to 25-5. The memory device is connected to a host computer.

In FIG. 1, when the data transferred from the host computer to the SRAM 23 is written to the flash memories 25-1 to 25-5, the data should be written to a vacant area because the flash memories 25-1 to 25-5 can not write information over existing information. Thus, such a measure should be taken as putting up an erase flag on old data whose new data has been written into a vacant area. When erase flags are used, contents of the memory are cleaned up and put in order by evacuating data having no erase flags to the evacuation area of the SRAM 23 by the unit of a predetermined size, erasing the areas of the memory to which data is to be written, and writing the evacuated data back to the memory.

Figure 2:
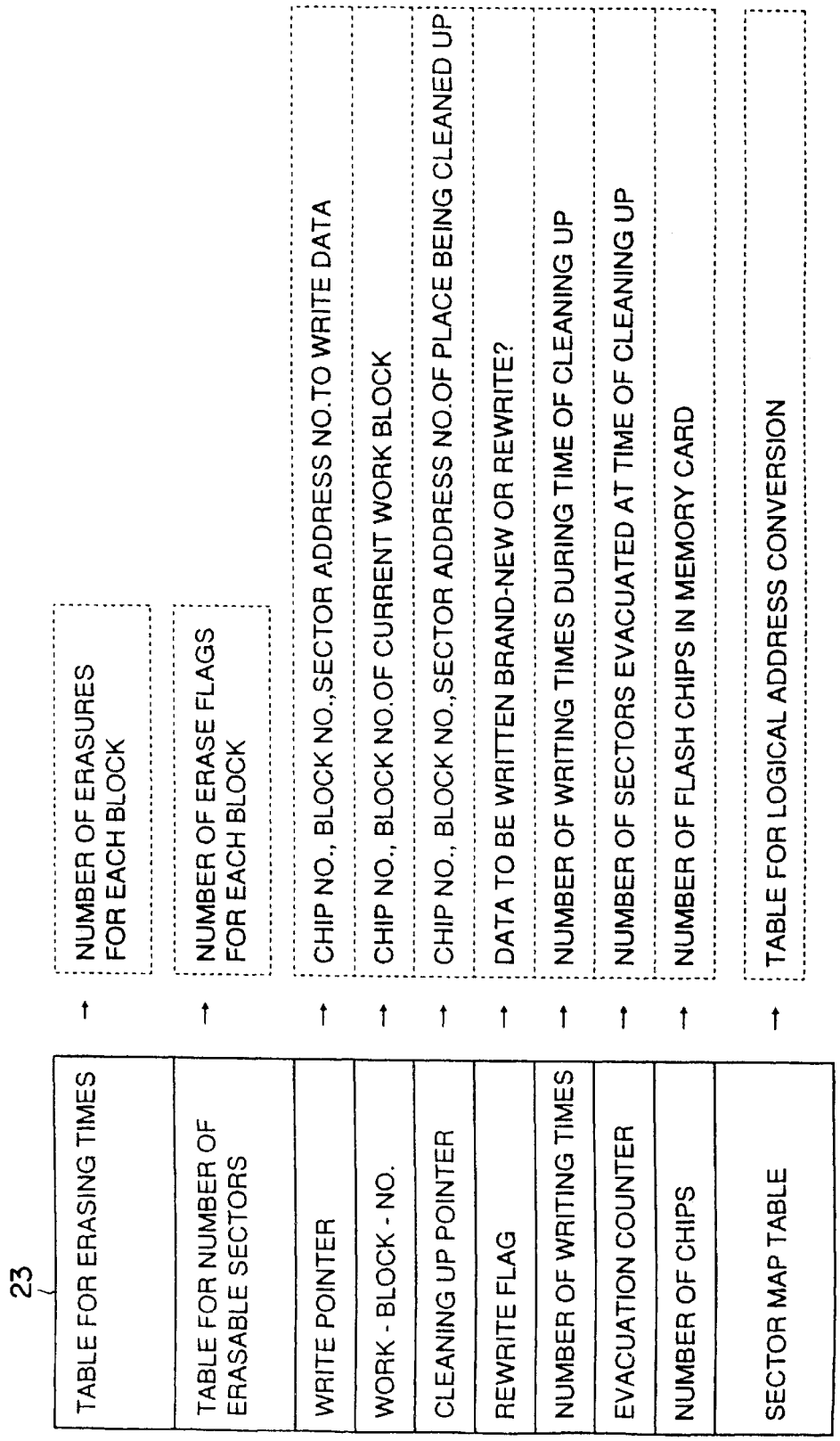
FIG. 2 is an illustration are illustrations showing contents of an SRAM of the memory device of FIG. 1.

FIG. 2 shows memory contents of the SRAM 23. As shown in FIG. 2, data stored in the SRAM 23 are as follows;

(1) Table for Erasing Times

This holds the number of erasures for each block of the flash memory.

(2) Table for Number of Erasable Sectors

This holds the number of erase flags (i.e., the number of erasable sectors) for each block.

(3) Write Pointer

This holds the chip No., the block No. and the sector address No. of the starting point to write data into the flash memory.

(4) Work Block No.

This holds the chip No. and the block No. indicating the current work-block No.

(5) Cleaning Up Pointer

This holds the chip No., the block No., and the sector address No. of the place which is being cleaned up.

(6) Rewrite Flag

This shows whether the data to be written is brand-new or replacing a corresponding old data.

(7) Number of Writing Times

This holds the number of times that writing is carried out during the time of cleaning up.

(8) Evacuation Counter

This holds the number of sectors evacuated at the time of cleaning up.

(9) Number of Chips

This holds the number of the flash chips in the memory card.

(10) Sector Map Table

This holds chip numbers, block numbers, and sector address numbers for logical address conversion.

Figure 3:
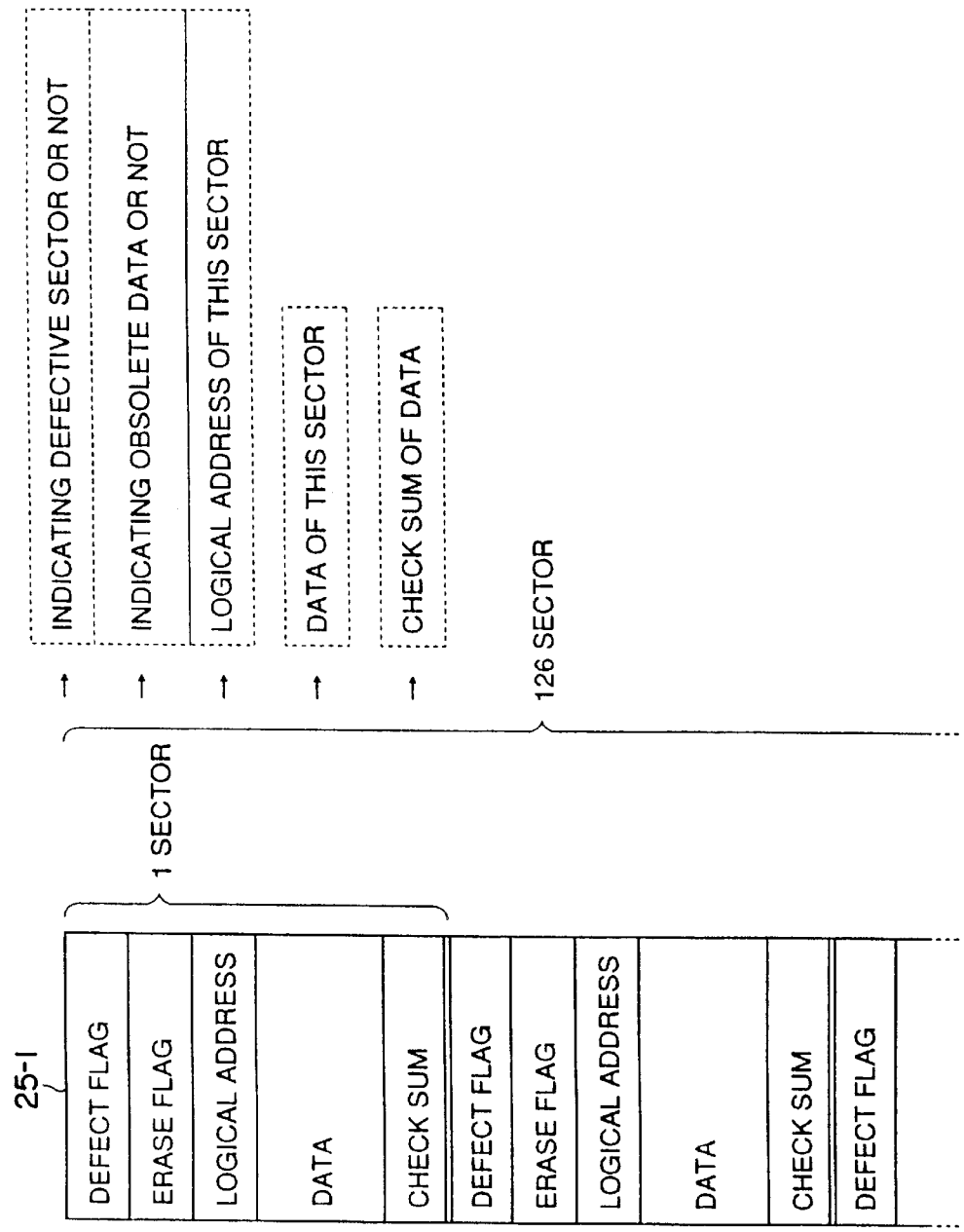
FIGS. 3 to 4 are illustrations showing contents of flash memories of 25-1 to 25-5 of the memory device of FIG. 1.
Figure 4:
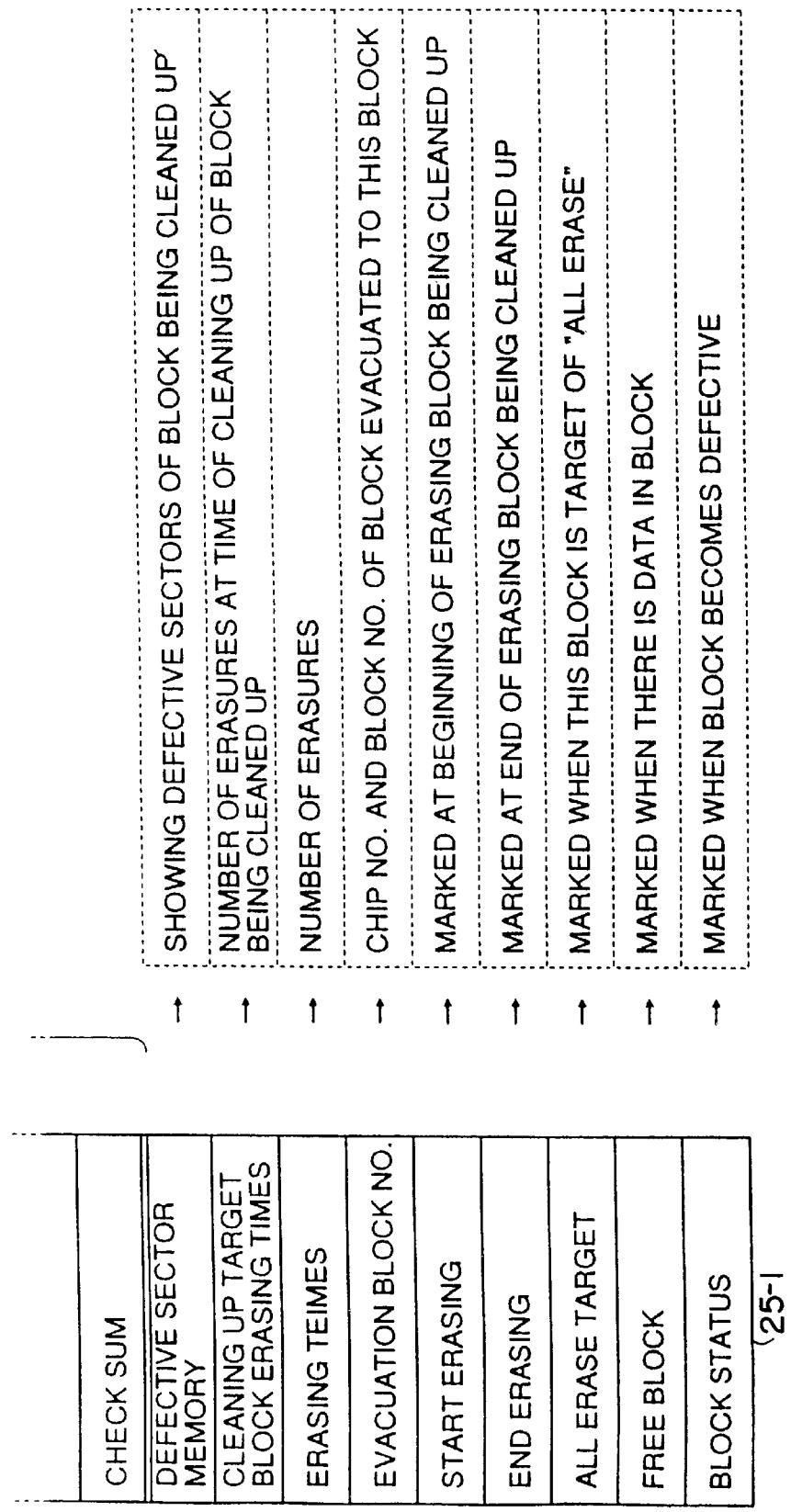

FIGS. 3 and 4 show memory contents of the flash memory 25-1 to 25-5, where each sector stores the management information and data shown in the following as (1) through (5). In this example, there are 126 sectors, each of which stores the management information and data of (1) through (5), and, also, the management information of (6) through (14) is stored in the area entailing the 126th sector.

(1) Defect Flag

This shows the status of the sector, and is marked when the sector becomes defective and cannot be used any more.

(2) Erase Flag

This shows the data status of the sector, and is marked when data of the sector becomes obsolete, for example, after a rewrite.

(3) Logical Address

This shows the logical address of the sector.

(4) Data

This holds data of the sector.

(5) Check Sum

This holds the check sum of data written in the sector.

(6) Defective Sector Memory

This shows defective sectors of the block in the process of being cleaned up.

(7) Cleaning Up Target Block Erasing Times

This shows how many times the block in the process of being cleaned up is erased at the time of cleaning up.

(8) Erasing Times

This shows how many times the block is erased.

(9) Evacuation Block No.

This holds the chip No. and the block No. of the block whose data is evacuated.

(10) Start Erasing

This flag is marked at the beginning of erasing the block in the process of being cleaned up.

(11) End erasing

This flag is marked at the end of erasing the block in the process of being cleaned up.

(12) All Erase Target

This flag is marked when this block is the target of "all erase".

(13) Free Block

This flag is marked when there is data in the block.

(14) Block Status

This shows the status of the block, and is marked when the block becomes defective and cannot be used any more.

FIGS. 5 to 10 are a flow chart of a process of the processor 22 in writing data to the flash memories 25-1 to 25-5. With reference to FIGS. 5 to 10, the writing operation will be described in detail.

Figure 5:
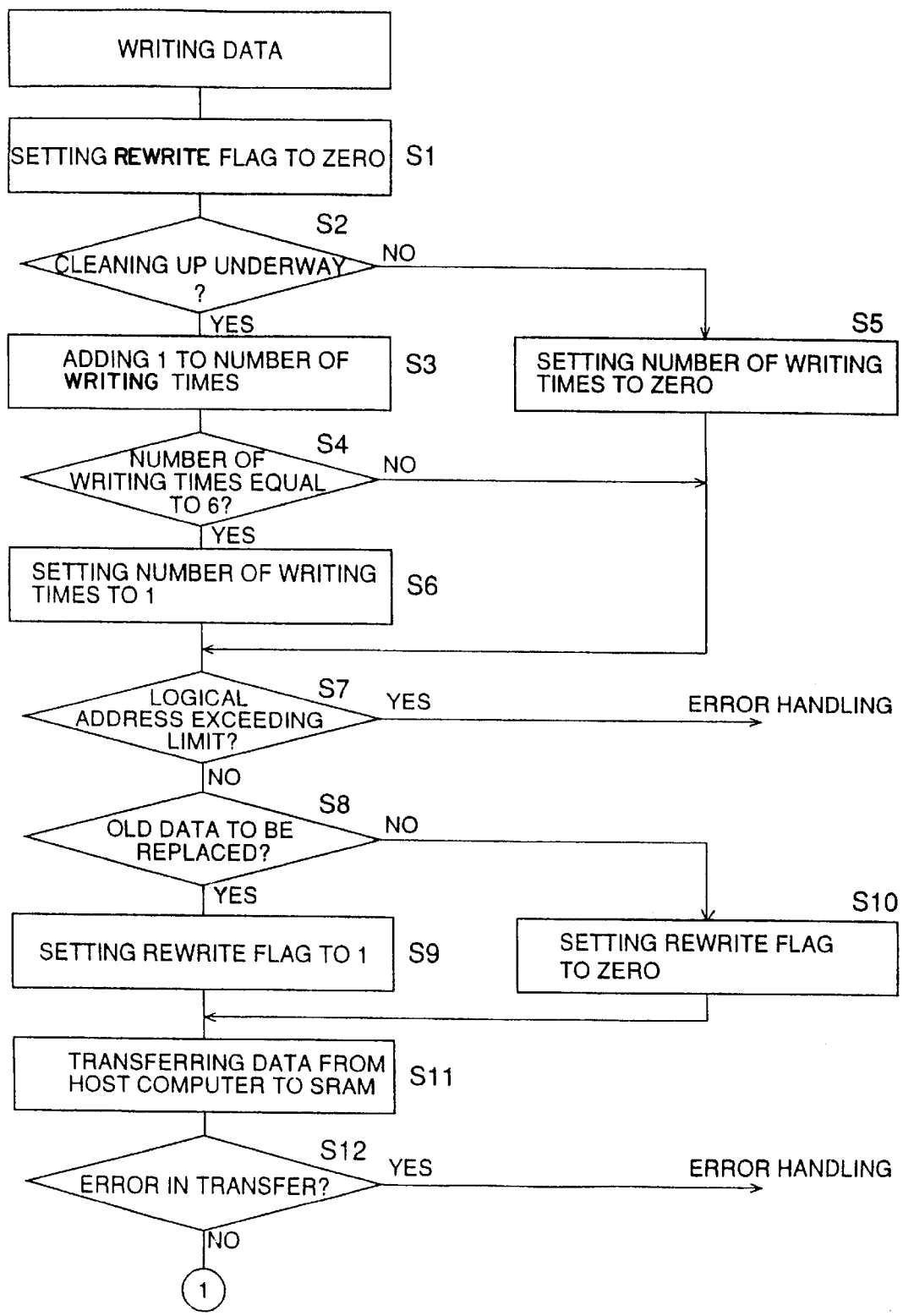
FIGS. 5 to 9 are a flow chart showing a writing process according to the present invention.

At a step S1 of FIG. 5, Rewrite Flag of the SRAM 23 which shows the data to be written is brand-new or replacing the old data is set to 0. At a step S2, it is determined whether cleaning up is underway. If it is not, go to a step S5, where Number of Writing Times of the SRAM 23 showing the number of times that writing is carried out during the time of cleaning up is set to 0, and, then, a step S7 is the next ste.

If cleaning up is underway, go to a step S3, where Number of Writing Times is added 1. At a step S4, a check is made if Number of Writing Times is equal to 6. If it is, go to a step S6, where Number of Writing Times is set to 1. If it is not, go to the step S7.

The process described above makes it sure that cleaning up is not carried out when Number of Writing Times is from 2 to 5, but is carried out only when Number of Writing Times is 1, so that cleaning up occurs after five times writing data to the flash memory to avoid excessive occurrence of cleaning up.

At the step S7, a check is made whether the logical address of the data to be written exceeds its limit, and if it does, error handling should be carried out.

If the logical address does not exceed its limit, go to a step S8, where a check is made if there is old data, i.e., if the data to be written is brand-new or replacing the old data. If it is not brand-new, the Rewrite Flag of the SRAM 23 is set to 1 at a step S9, and, then, a step S11 is the next step to proceed. If the data to be written is brand-new, the Rewrite Flag of the SRAM 23 is set to 0 at a step S10, and, then, the step S11 is the next step.

At the step S11, data is transferred from the host computer to the SRAM 23, and a check is made at a step S12 whether an error occurred during the transfer. If it did, error handling must be carried out. If there is no error, go to a step S13 of FIG. 6, where Rewrite Flag is checked to see if the data to be written is brand-new. If it is not brand-new, i.e., the data is to be rewritten, Erase Flag is marked at the sector holding the old data at a step S14, and, then, a step S15 is the next step.

At the step S15, a check is made whether Number of Writing Times of the SRAM 23 is 1. If it is 1, the flash memory is cleaned up at the steps following the step S15. If Number of Writing Times is not 1, go to a step S46 of FIG. 9 and the data stored in the SRAM 23 is written into the flash memory.

Figure 8:
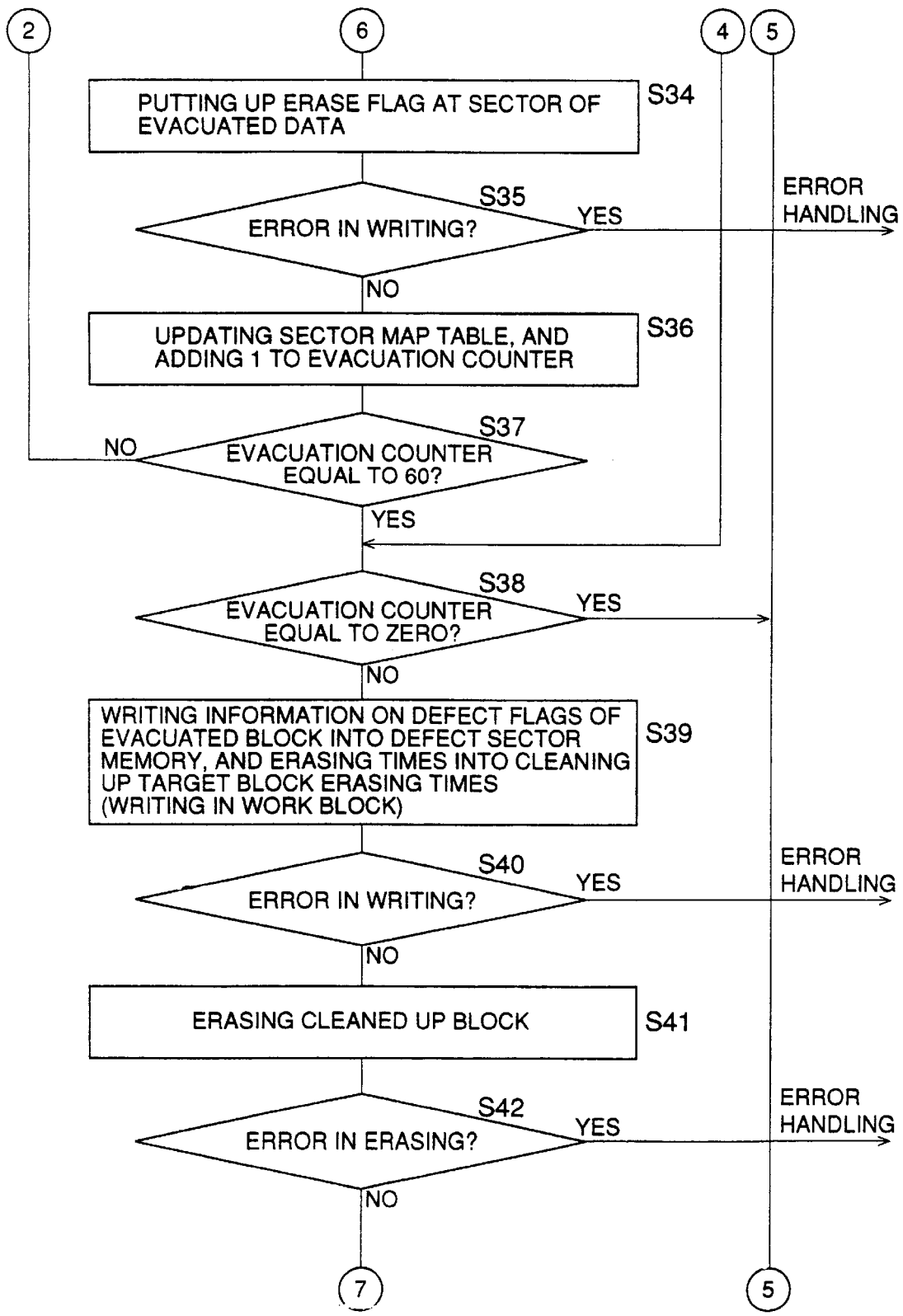
Figure 9:
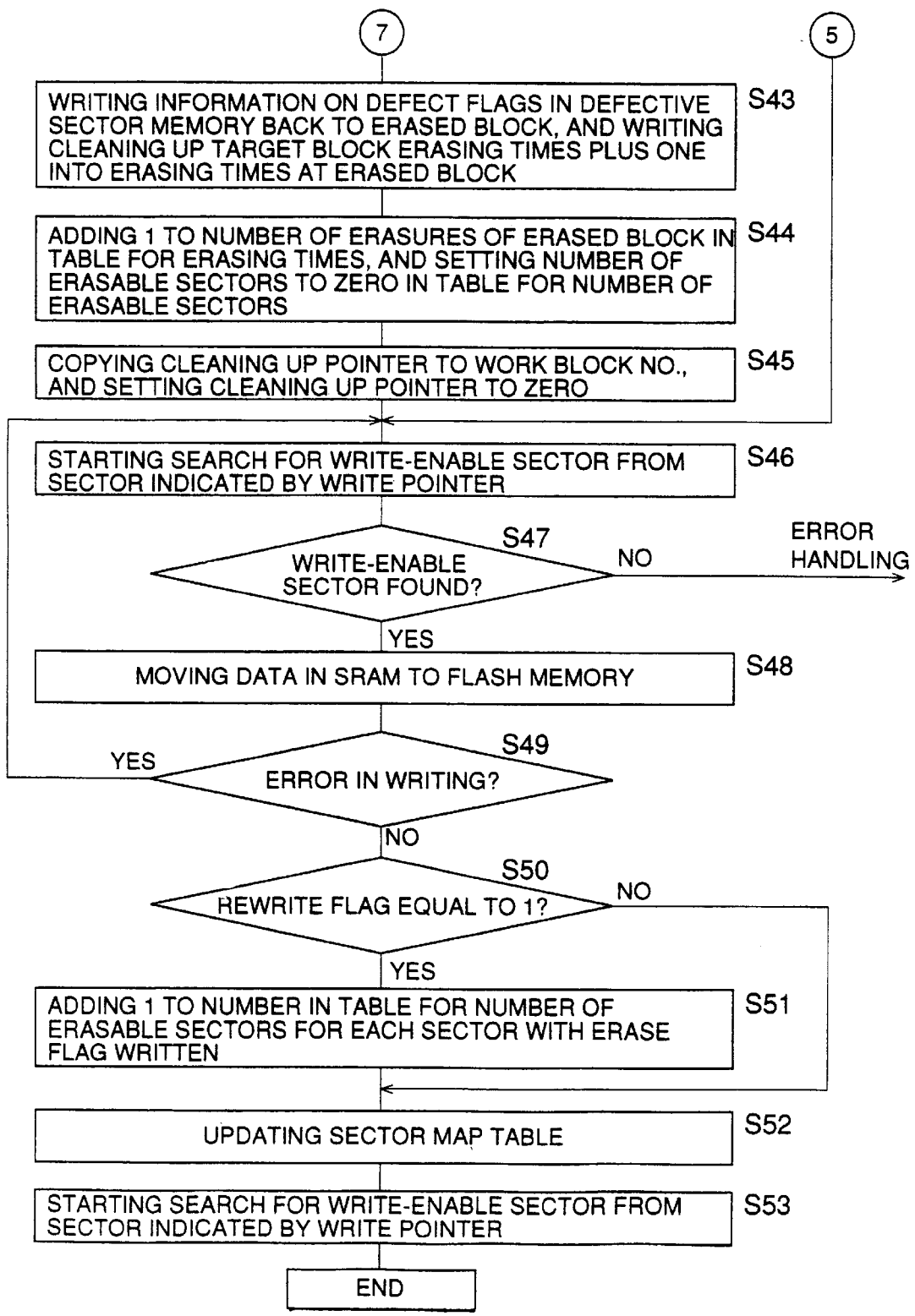
Figure 10A:
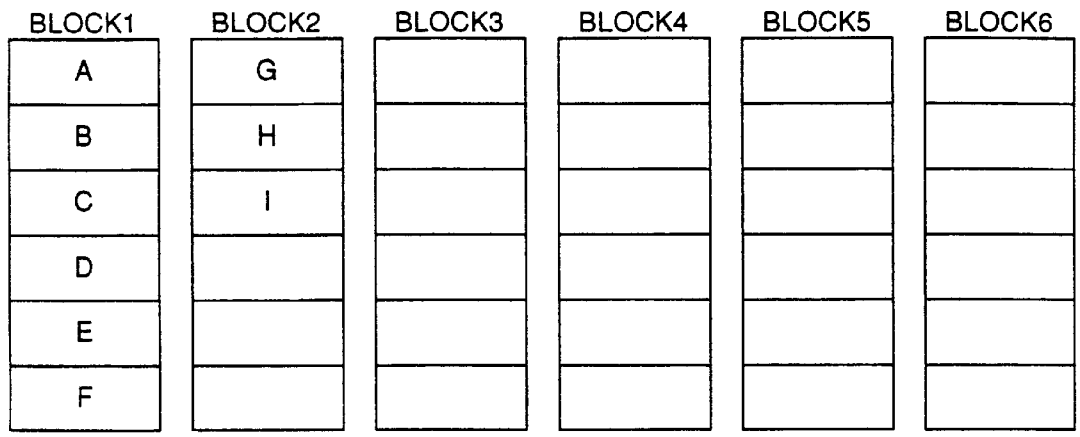
Figure 10B:
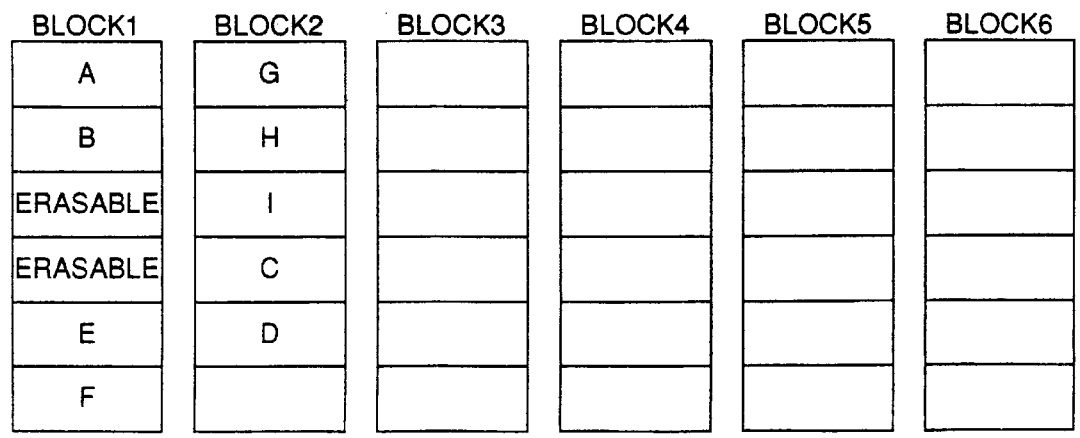
Figure 10E:
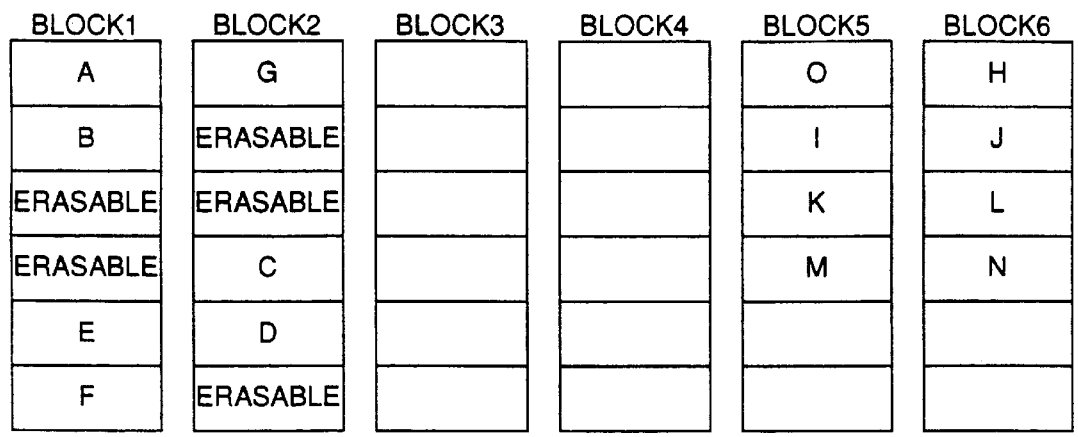
Figure 10F:
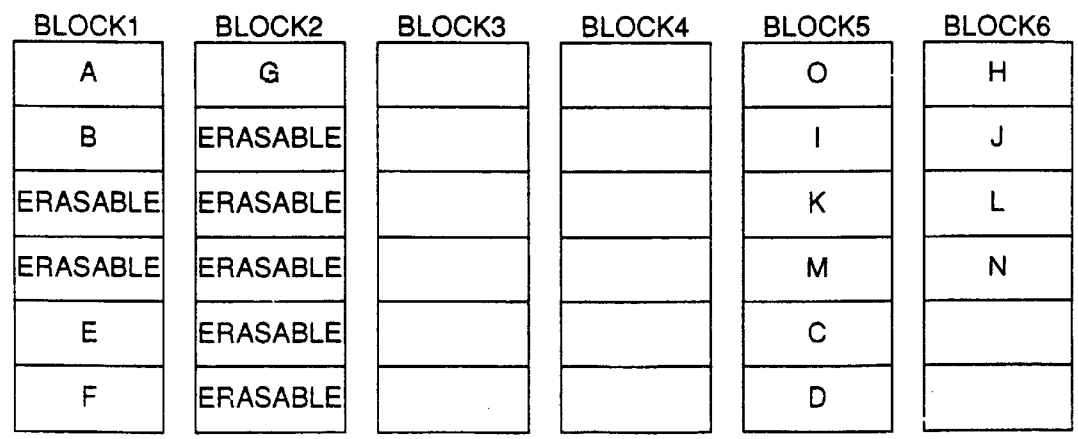

At a step S16, Evacuation Counter of the SRAM 23, which holds the number of sectors evacuated at the time of cleaning up, is set to 0. At a step S17, a check is made whether a Cleaning Up Pointer indicating the address of the sector being cleaned up is smaller than 126. If it is not smaller than 126, cleaning up is finished, and a step S38 of FIG. 8 is the next step. If Cleaning Up Pointer is smaller than 126, proceed to a step S18, where a check is made if Cleaning Up Pointer is 0. If it is not 0, go to a step S22. 20 If Cleaning Up Pointer is 0, the target of cleaning up is selected by using the number of erasures and erasable sectors of each block obtained from the tables of the SRAM 23. At a step 20, the chip No. and the block No. of the target of cleaning up is written into Evacuation Block No. of the Work Block in the flash memory.

At a step S21, a check is made if there occurred an error in writing the chip No. and the block No., and if it did, error handling must be carried out. If no errors occurred, go to the step S22.

At the step S22, a search is made for data to be evacuated. That is, if Erase Flag of the current sector is marked, go to the next sector. If there is no logical address written, Erase Flag is marked at the current sector, and the next sector is searched for. If the logical address is anomalous, Erase Flag and Defect Flag are both marked, and the next sector is searched for.

Figure 7:
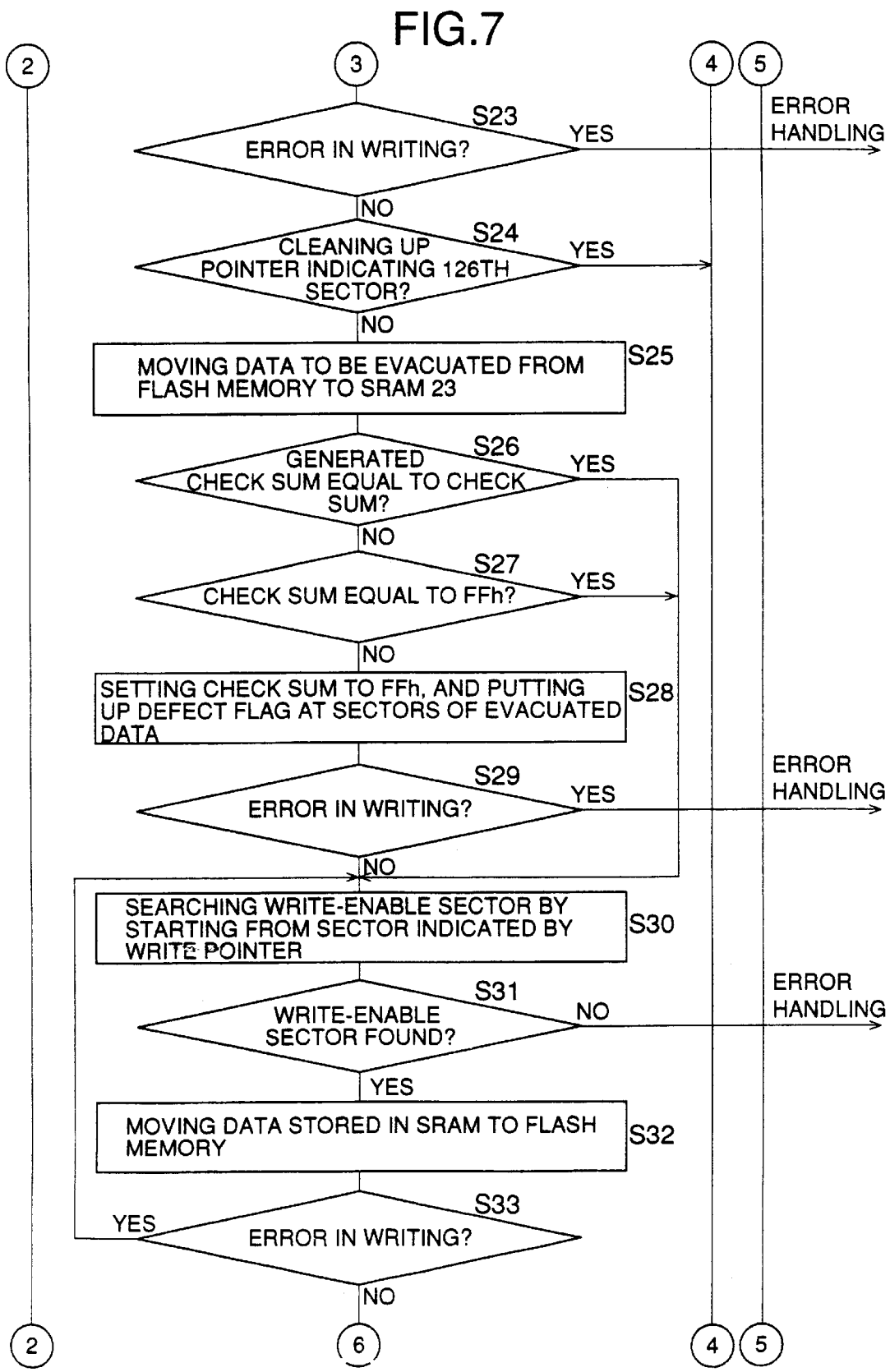

At a step S23 of FIG. 7, a check is made whether there has been an error. If not, it is checked whether Cleaning Up Pointer indicates the 126th sector, and if it does, cleaning up is finished, and a step S38 of FIG. 8 is the next step.

If Cleaning Up Pointer is not 126, proceed to a step S25, where data to be evacuated is moved from the flash memory to the SRAM 23. At a step S26, it is checked whether the check sum generated corresponds to Check Sum of the sector in the flash memory (refer to FIG. 3). If it does not correspond, a check is made at a step S27 whether the check sum is FFh.

If the check sum is not FFh, Check Sum is set to FFh and Defect Flag is marked at a step S28 for the sector of the data attempted to be evacuated, and, a step S29 is the next step to proceed. At the step S29, a check is made if there occurred an error, and if not, proceed to a step S30.

If the check sum corresponds to Check Sum at the step S26 or turns out to be FFh at the step S27, go to the step S30. At the step S30, a search for a write-enable sector is started from the sector indicated by Write Pointer. Then, at a step S31, it is checked whether there is a write-enable sector. If there is not, error handling must be carried out. If there is a write-enable sector, go to a step S32, where the data stored in the SRAM 23 is moved to the flash memory.

At a step S33, a check is made whether an error occurred in writing the data, and if it did, go back to the step S30. If no errors occurred, go to a step S34 of FIG. 8, where Erase Flag of the sector whose data has been evacuated is marked.

At a step S35, a check is made whether an error occurred in writing Erase Flag. If no error occurred, Sector Map Table is updated at a step S36, and Evacuation Counter is incremented by 1 in the SRAM 23.

Then, at the step S37, it is checked whether evacuation has occurred a predetermined number of times (60 times in the preferred embodiment). If it did, stop the cleaning up of the flash memory to go to the step S38. If the number of times of evacuation is less than 60, go back to the step S22 of FIG. 6 to repeat the process described above.

Figure 6:
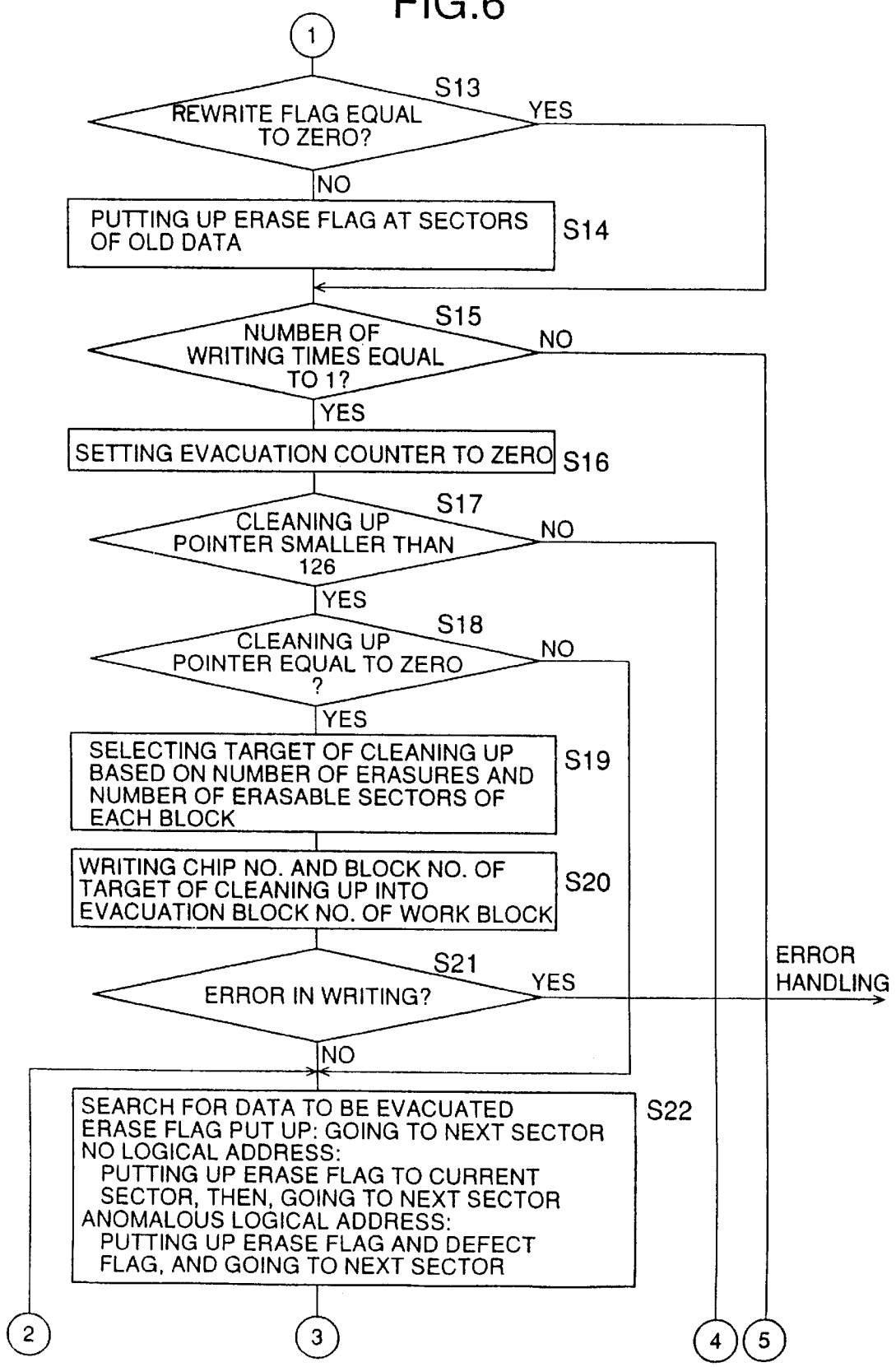

If Evacuation Counter is 60 or Cleaning Up Counter turns out to be no less than 126 at the step S17 of FIG. 6, a check is made at the step S38 whether Evacuation Counter is 0.

If Evacuation Counter is 0, i.e., if Cleaning Up Counter is no less than 126 and there has been no evacuation, go to a step S39, and processes like writing Defect Flags to defective sector memories are carried out at the successive steps starting from the step S39.

In other words, if Evacuation Counter is 0, it means that the processing time was short enough to carry out pending processing, so that processes like writing Defect Flags to defective sector memories are carried out at the steps starting with S38. If Evacuation Counter is not 0, go to a step S46 of FIG. 9, moving the data in the SRAM 23 to the flash memory and the following processes are carried out from that point.

At the step S39, information on Defect Flags of the evacuated block is written into Defect Sector Memory (FIG. 4) and Erasing Times of the evacuated block is written into Cleaning Up Target Block Erasing Times (FIG. 4) both at the block of the evacuation destination (Work-Block). At a step S40, a check is made whether an error occurred in writing those. If no error occurred, go to a step S41, where the cleaned up block is erased. At a step S42, a check is made whether an error occurred in erasing the block, and if there is no errors, go to a step S43 of FIG. 9, where information on Defect Flags stored in Defect Sector Memory is written back to the erased block and Cleaning Up Target Block Erasing Times plus one is written into Erasing Times of the erased block.

At a step S44, the number of erasures of the erased block is incremented by 1 in Table for Erasing Times, and the number of erasable sectors is set to 0 in Table for Number of Erasable Sectors. At a step S45, Cleaning Up Pointer is copied to Work Block No., and, then, set to 0.

Then, at the step S46, a search for a write-enable sector is started from the sector indicated by Write Pointer. At a step S47, a check is made whether there is a write-enable sector. If there is, go to a step S48, where the data stored in the SRAM 23 is moved to the flash memory. At a step S49, it is checked if an error occurred in writing the data.

If an error occurred, go back to the step S46, and if it did not, go to a step S50. At the step S50, a check is made whether Rewrite Flag is 1, i.e., whether the data written is brand-new. If Rewrite Flag is 1, a number in Table for Number of Erasable Sectors (FIG. 2) is added 1 at a step S51 for each sector into which Erase Flag was written. The step S52 is the next step to proceed.

In the case that Rewrite Flag turns out to be 0 at the step S50, Sector Map Table (FIG. 2) is updated at the step 52, and a search is made for a write-enable sector by starting from the sector indicated by Write Pointer in preparation for the next writing process. This is the end of the process.

B. Writing/Erasing Process for Data Evacuation and Free Area Creation

As described above, the flash memory has a limit in the number of times that erasing can be carried out, so that the numbers of erasures need to be averaged across the memory area for an effective use of the entire memory.

Also, it is not possible to write data over existing data so that data for rewrite needs to be written into new sectors while the old data is marked by flags and the like so as to be erased later at a convenient time.

Thus, it is necessary to set aside free memory areas for new data to be written by erasing old erasable data in the memory. Also, when the free areas become dysfunctional due to defective blocks and the like, it is necessary to take a counter measure to create new free areas.

The processing of memory areas according to preferred embodiment of the present invention will be described, such as, the and a counter measure for creating free areas in the case of defective blocks.

The flash memory needs a free area in the memory space for writing data. This embodiment shows a counter measure for creating free areas, when free areas prepared previously become unable to be used any more due to defective blocks and the like.

FIGS. 14A to 14R show a process of creating free areas according to this embodiment of the present invention, and this embodiment will be described by using FIGS. 14A to 14R. First of all, this embodiment has the following as its basis.

1. There are seven blocks each with six sectors. Reading/writing is carried out by the unit of sector, and erasing by the unit of block.
2. The method of writing is of add-on writing, i.e., when writing a logical sector having the same address as that of logical sector existing in the memory, the physical sector of the existing logical sector is marked with Erase Flag.
3. One block is set aside as a backup area (block 0) in case of a malfunction. The area for add-on writing is 5 blocks plus an evacuation area block (blocks 1 through 6).
4. When there are no more writing areas, data in the unerasable physical sectors of the block which has the largest number of physical sectors with Erase Flags attached are moved to an evacuation area, and this block is erased. Then, the block just erased is used as an evacuation area block, and the previous evacuation area is in turn used as a writing area. (This whole process is called evacuation process.)
5. The addresses of sectors sent from the host computer are A through P.

In FIG. 14A, sectors A through G are written. Since there are no identical logical sectors, the logical sectors A through G are written without taking any other action.

In FIG. 14B, the logical sectors A and D through G are written. Since there exist the identical logical sectors A, D, E, F, and G, the logical sectors A and D through G are written after putting up Erase Flags at those identical logical sectors.

In FIG. 14C, logical sectors H through N are written. Since there are no identical logical sectors, the logical sectors H through N are written without taking any other action.

In FIG. 14D, the logical sectors A and G through L are written. Since there exist the identical logical sectors A, G, H, I, J, K, and L, the logical sectors A and G through L are written after putting up Erase Flags at those identical logical sectors.

In FIG. 14E, the logical sectors A and H through J are written. Since there exist the identical logical sectors A, H, I, and J, the logical sectors A and H through J are written after putting up Erase Flags at those identical logical sectors.

In FIG. 14F, it is attempted to write the logical sectors A and I through L. Since there are no writing areas left, however, an evacuation process has to be carried out. That is, unerasable data in the block with the largest number of data with Erase Flags (block 3) are moved to the evacuation area block (block 6), and the block 3 which has been just evacuated is erased. Then, the block 3 is used as an evacuation area, and the previous evacuation area (block 6) is newly used as a writing area.

Then, in FIG. 14G, the logical sectors A and I through L are written into the block 6.

In FIG. 14H, it is attempted to write the logical sectors A, M, and N. Since there are no writing areas left, however, an evacuation process has to be carried out. That is, unerasable data in the block with the largest number of data with Erase Flags (block 5) are moved to the evacuation area block (block 3), and the block 5 which has been just evacuated is erased. Then, the block 5 is used as an evacuation area, and the previous evacuation area (block 3) is newly used as a writing area.

At this point, assume that the block 5 becomes unable to be used any more due to a failure of erasing the block 5. There are no evacuation areas in this case, so that a counter measure has to be taken.

As shown in FIG. 14I, an evacuation process is carried out by taking the backup block 0 as an acting evacuation area. That is, unerasable data in the block with the largest number of erasable data in FIG. 14H (block 1) are moved to the acting evacuation area block (block 0), and the block 1 which has just been evacuated is erased. Then, the block 1 is used as an evacuation area. Then, as shown in FIG. 14J, the backup block (block 0) is evacuated. That is, the logical sectors B and C of the backup area (block 0) used as an acting evacuation area are moved to the block 3.

Through the above process, a backup area and an evacuation area are created, and the logical sectors A, M, and N are written into the block 3 as shown in FIG. 14K.

Then, it is attempted to write the logical sectors A, G, H, O, and P. Since there are no writing areas left, however, an evacuation process is carried out as shown in FIG. 14L. That is, unerasable data in the block with the largest number of erasable data (block 4) are moved to the evacuation area block (block 1), and the block 4 which has been just evacuated is erased. Then, the block 4 is used as an evacuation area.

In FIG. 14M, the logical sectors A, G, H, O, and P are written. Since there exist the identical sectors A, G, and H, the logical sectors A, G, and H are written into the block 1 after putting up Erase Flags. The logical sectors O and P are just written into the block 1 without doing anything else.

Then, in FIG. 14N, writing the logical sector A is attempted. Since there are no writing areas left, an evacuation process is carried out. As a result, the block 2 becomes a new evacuation area, and the sectors D, E, and F in the block 2 are moved to the block 4.

If the block 2 then becomes unable to be used any more due to a failure erasing the block, no evacuation area is left so that the counter measure same as before is taken. That is, data in the block with the largest number of erasable data (block 3) are moved to the acting evacuation area block (block 0), and the block 3, which has been just evacuated is erased. Then, the block 3 is used as an evacuation area. FIG. 14O shows the result of this.

Should this ongoing process be stopped at this point of time due to a power failure and the like, the host computer upon the restart of the process can conclude that this process was on the way to creating a free area since there is some data but no erasable sectors in the backup area.

As continuation of the process, a counter measure to create free areas is taken so that the sectors I and J of the block 6 are moved to the backup area (block 0), and the sectors K and L of the block 6 are moved to the block 3. FIG. 14P shows the result of this action.

At this point, the number of free sectors other than the sectors of the evacuation area has become larger than the number of data in the backup area (block 0), a search is made for a free sector by moving Write Pointer from the last sector of the evacuation area. Then, the data of the backup area (block 0) are moved to the free areas found by the search.

In case that this ongoing process is stopped due to a power failure and the like at the moment when the sectors B, C, M, and N of the backup area (block 0) are moved to the block 3 as shown in FIG. 14Q, the host computer upon the restart of the process can conclude that the process of creating a free block is at the step of moving data out of the backup area since there are some erasable data left therein.

As a continuation of the process, the logical sector I and J of the backup area (block 0) are moved to the block 4 in FIG. 14R. This is the end of the process.

Figure 15:
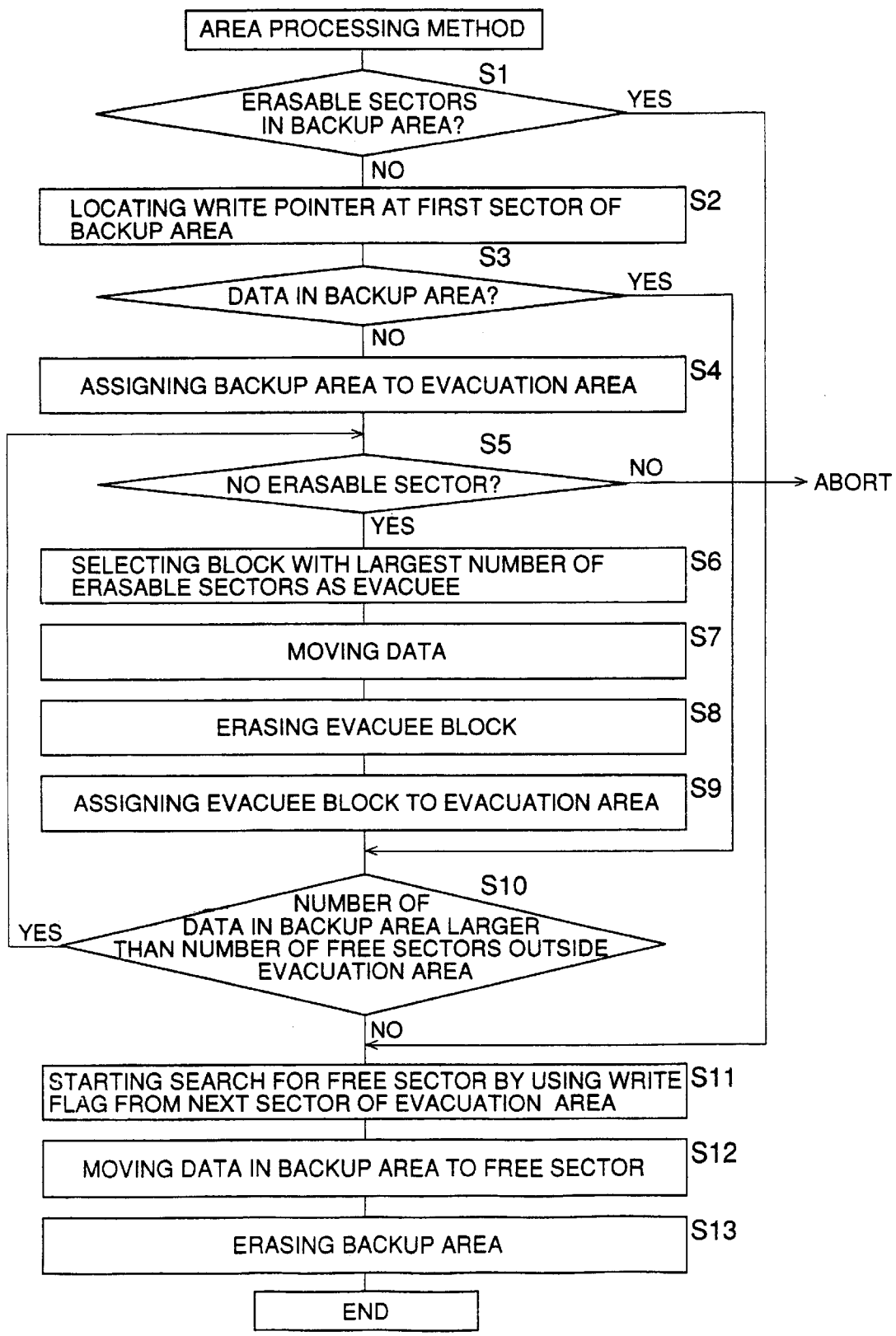
FIG. 15 is a flow chart showing a process of creating a free area.

FIG. 15 shows a flow chart of the process of creating free areas according to the second embodiment of the present invention. The process of the second embodiment will be described below by using this flow chart.

At a step S1, a check is made whether there are erasable sectors in the backup area, and if there are, go to a step S11. If there are no erasable sectors, go to a step S2, where Write Pointer is located at the first sector of the backup area. At a step S3, then, a check is made if there is data in the backup area. If there is data, go to a step S10, and if there is no data, proceed to a step S4, where the backup area is assigned to the evacuation area.

At a step S5, a check is made whether there are no erasable sectors in all the blocks. If there are no erasable sectors, free areas cannot be created so that the process is aborted at the step S5. If there are erasable sectors, proceed to a step S6, where the block with the largest number of erasable sectors is selected as an evacuee. At a step S7, data in the block of the evacuee are moved to the backup area serving as the evacuation area.

At a step S8, the block of the evacuee is erased, and at a step S9, the block of the evacuee is in turn newly assigned to the evacuation area.

At the step S10, a check is made whether the number of data in the backup area is larger than the number of free sectors outside the evacuation area. If it is larger, go back to the step S5 to repeat the above process. If the number of data in the backup area is not larger, proceed to a step S11, where a free sector is searched for by moving Write Flag in the writing direction starting from the next sector of the evacuation area. At a step S12, data in the backup area are moved to the free sectors found at the step S11. At a step S13, the backup area is erased. This is the end of the process.

In this embodiment, free areas are created as described above. Thus, even if some blocks become unable to be used in the memory space, a counter measure can be taken to create a free area. This prevents the memory device from ceasing to function in such a case.

Also, even if the process is terminated during processing due to a power failure and the like, it is easy to decide at what step the process was terminated so that this decision making process can be simplified.

C. Enhancement of Erasing Process

As described above, flash memories cannot write data over existing data before erasing the existing data. This embodiment shows a method that can perform an efficient erasing process for erasing the entire memory space and that can restart the erasing process in the case of process termination by providing both Write Flag for indicating that there is written data and Executing Flag for indicating that an erasing process for erasing the entire memory space is underway.

Figure 16D:
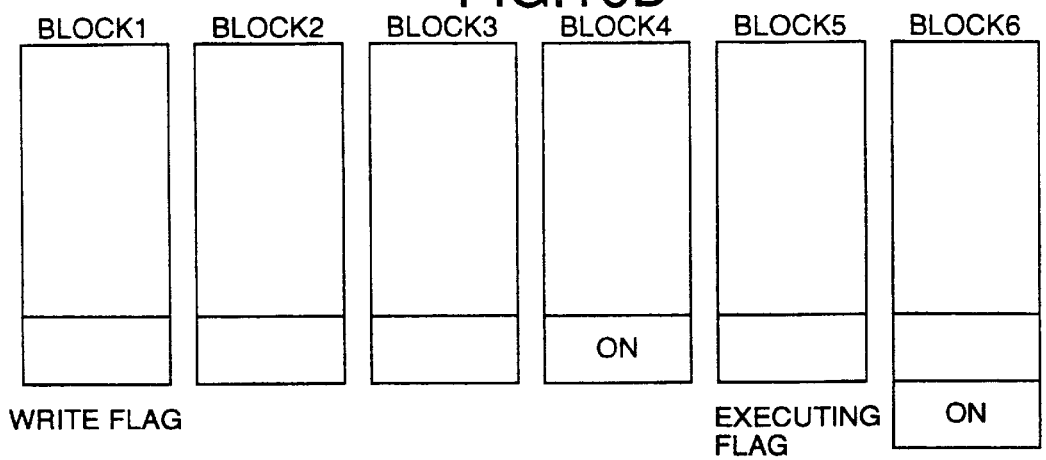
FIGS. 16A and 16F are illustrative drawings showing an embodiment of a erasing process according to the present invention.
Figure 16E:
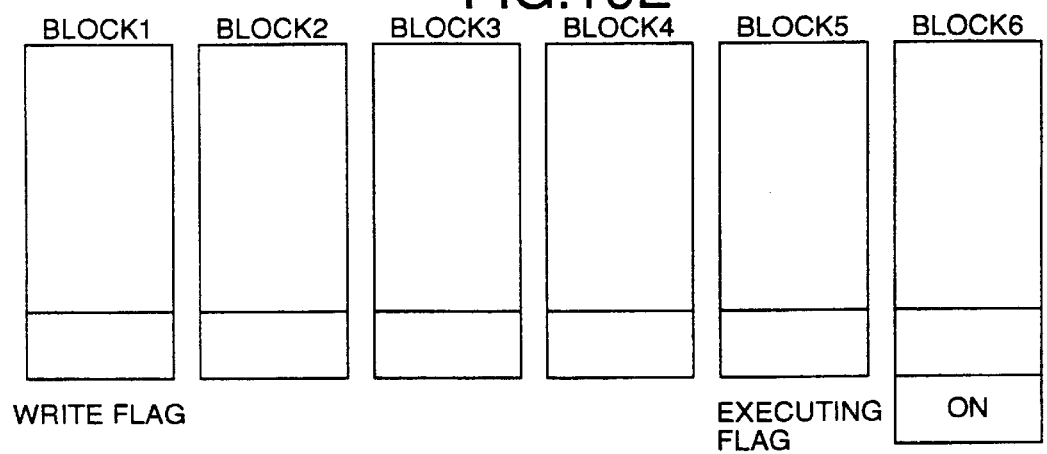
Figure 16F:
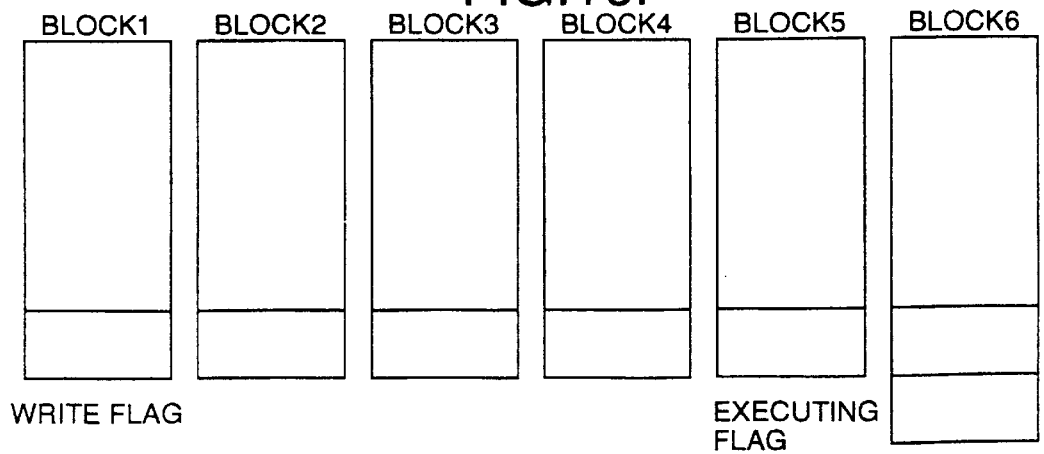

With reference to FIGS. 16A and 16F, the process of this embodiment will be described below. In this embodiment, there are six blocks, where each block is provided with an area for storing Write Flag and the block 6 is provided with an area for storing Executing Flag indicating that an entire space erasing process is underway.

In FIG. 16A, the blocks 1, 2, and 4 have Write Flags which were written into the block 1, 2, and 4 at the time of writing data into those blocks.

Then, before starting the initialization process of erasing the entire memory space, Executing Flag is written into the block 6 as shown in FIG. 16B.

In FIG. 16C, the block 1 which has Write Flag is erased, and Write Flag is deleted also.

In FIG. 16D, the block 2 which has Write Flag is erased, and Write Flag is deleted also.

Even if the process moves to a stop sequence by some reason and, then, is restarted later on, it can be concluded straightaway that an initialization is an underway since there is Executing Flag written in the block 6. Thus, the initialization process can be resumed.

In FIG. 16E, since there are no Write Flags written in the block 1, 2, and 3, the block 4 is erased and the Write Flag thereof is deleted also.

In FIG. 16F, since there are no Write Flags written in the block 1 through 5, the block 6 is erased to delete the Executing Flag thereof.

Figure 17:
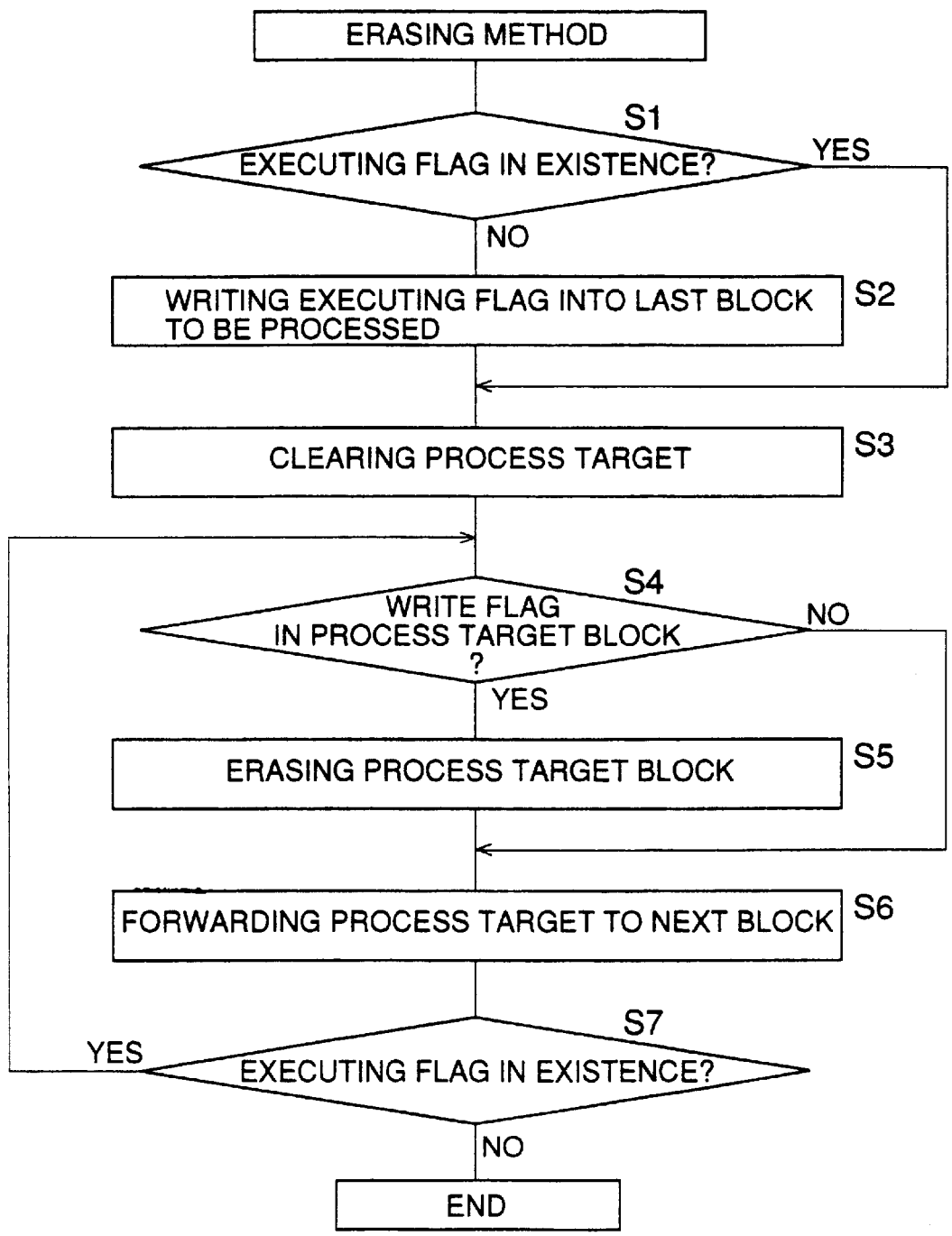
FIG. 17 is a flow chart showing an erasing process.

FIG. 17 shows a flow chart of this embodiment, which will be described below.

At a step S1, a check is made whether there is an Executing Flag, and if there is, go to a step S3. if there is no Executing Flag, an Executing Flag is written into the last block to be processed.

At the step S3, the process target is cleared. At a step S4, a check is made whether Write Flag is set in the process target block. If it is not set, go to a step S6, and if it is set, go to a step S5 to erase the process target block. At the step S6, the process target is proceeded to the next block.

At a step S7, it is checked if Executing Flag is set, and if it is set, go back to the step S4 to repeat the above process. If no Executing Flag is set, end the process.

Since Write Flag is provided as described above in this embodiment, unnecessary erasing can be avoided, which leads to a shorter processing time and a longer life of the memory media.

Also, Executing Flag is provided to indicate that the initialization process is underway, so that an unexpected termination of the process can be handled.

D. Enhancement of Writing Speed and Allocation of Backup Areas in Case of Defective Sectors As described above, flash memories cannot write data over existing data before erasing the existing data. Thus, it is necessary to mark sectors with Erase Flags when there are identical sectors and to erase sectors marked with Erase Flags later on at a time of convenience. This means that a writing process takes a relatively long time.

Also, the flash memory has a limit in the number of erasures, and cannot be erased anymore after experiencing erasing this limiting number of times. Thus, when there occurred defective sectors, it is required that a counter measure be taken by allocating backup areas.

This embodiment which will be described below shows a method of assigning backup areas in the case of defective sectors and enhancing the memory writing speed by eliminating the time lag at the time of writing in the memory to which data cannot be written over existing data and cannot be erased by the unit of sector.

Figure 18:
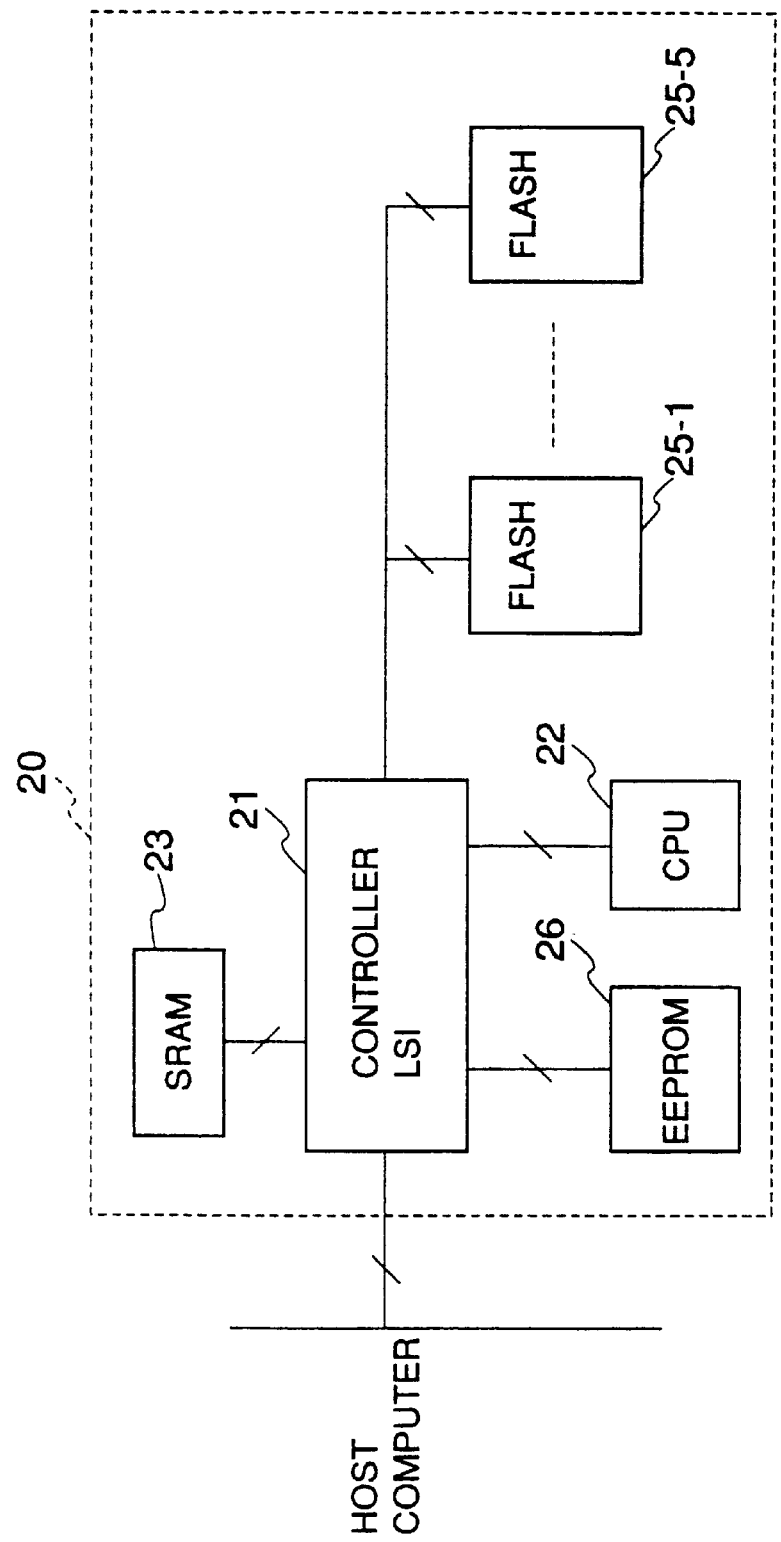
FIG. 18 is a block diagram of a system structure of an embodiment for enhancing a writing speed according to the present invention.

FIG. 18 shows a block diagram showing the structure of a system according to this embodiment. The system of FIG. 18 differs from the system of FIG. 1 only in an additional EEPROM 26. The EEPROM 26 contains a decoding table for address conversion. When part of the flash memory becomes defective, a counter measure is taken by rewriting the EEPROM 26. In FIG. 18, the EEPROM 26 is used for storing a decoding table, but any memories capable of rewrite, e.g., the flash memory, can be used for that purpose.

(1) First Embodiment

FIGS. 19A and 19B show block diagrams of a system according to a first embodiment. In FIG. 19A, a sector conversion unit 261 includes the EEPROM 26 (or ROM capable of rewrite, e.g., a flash memory). A flash memory 25-1 includes a first area A, a second area B, and a backup area C. The first area A and the second area B are provided with four sectors 1 through 4.

In FIG. 19A, when writing data into the sector 1, a check is made on the first area A and the second area B. If the first area A already has other data therein, the data is written into the second area B. At the same time, the sector 1-A of the first area A is erased.

If an error occurred in writing the data, a sector of the backup area C is used as an alternate sector.

That is, ROM in the sector conversion unit 261 is rewritten in order to use a sector of the backup area C substituting for the sector 1-A of the first area A, which had an error in writing the data. The result is shown in FIG. 19B, where one sector of the backup area C is allocated for the sector 1-A.

As described above, when errors occur, sectors of the backup area are allocated as long as there remain sectors in the backup area. When there are no more sectors in the backup area, all the data in the flash memory 25-1 are evacuated to external areas like the SRAM 23 of FIG. 18. The ROM in the sector conversion unit 261 are rewritten to divide an available space into a data space and a backup space. By excluding defective sectors, sectors are allocated successively in a descending order or an ascending order of the address depending on the type of the system.

In this embodiment, the writing and erasing of data can be performed simultaneously so that the time lag at the time of writing can be eliminated and a writing speed can be increased. Also, since backup areas are provided to substitute for defective sectors, the development of defective sectors is not a problem.

(2) Second Embodiment

Figure 20A:
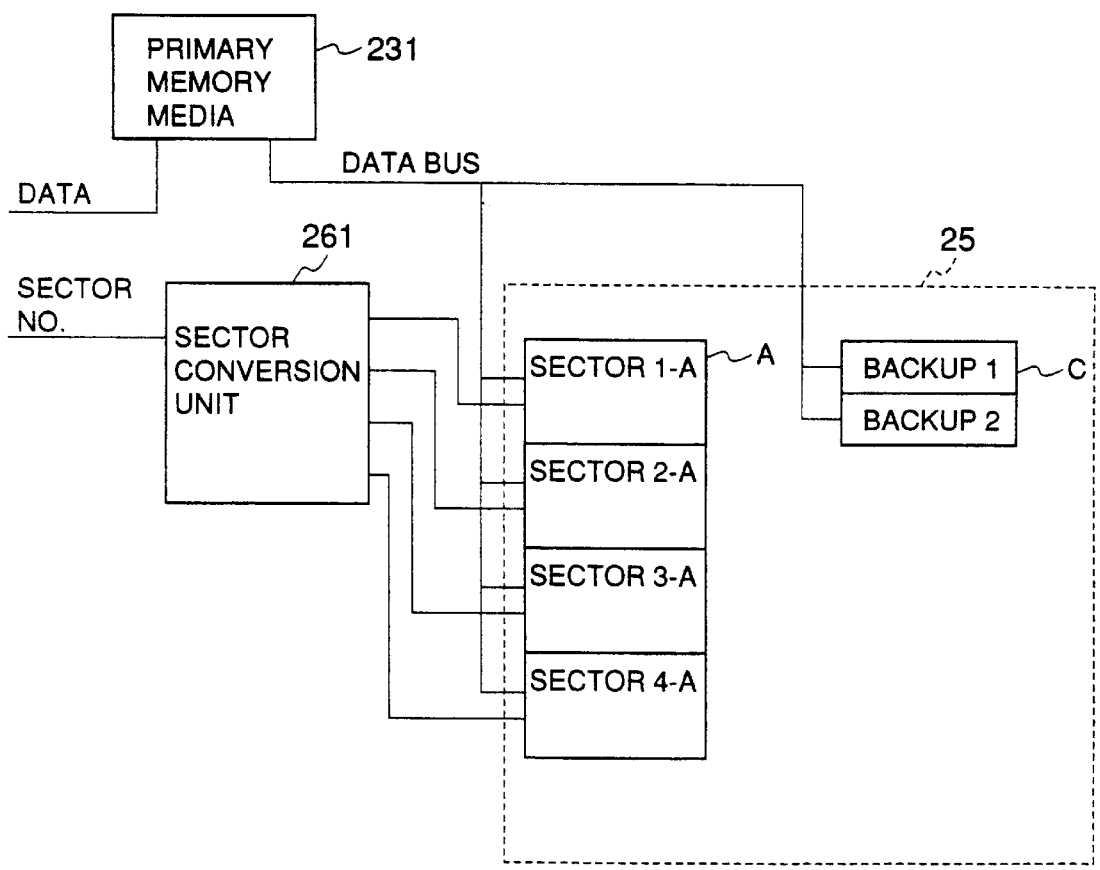
FIGS. 20A and 20B are illustrative drawings showing a second embodiment of enhancing a writing speed according to the present invention.
Figure 20B:
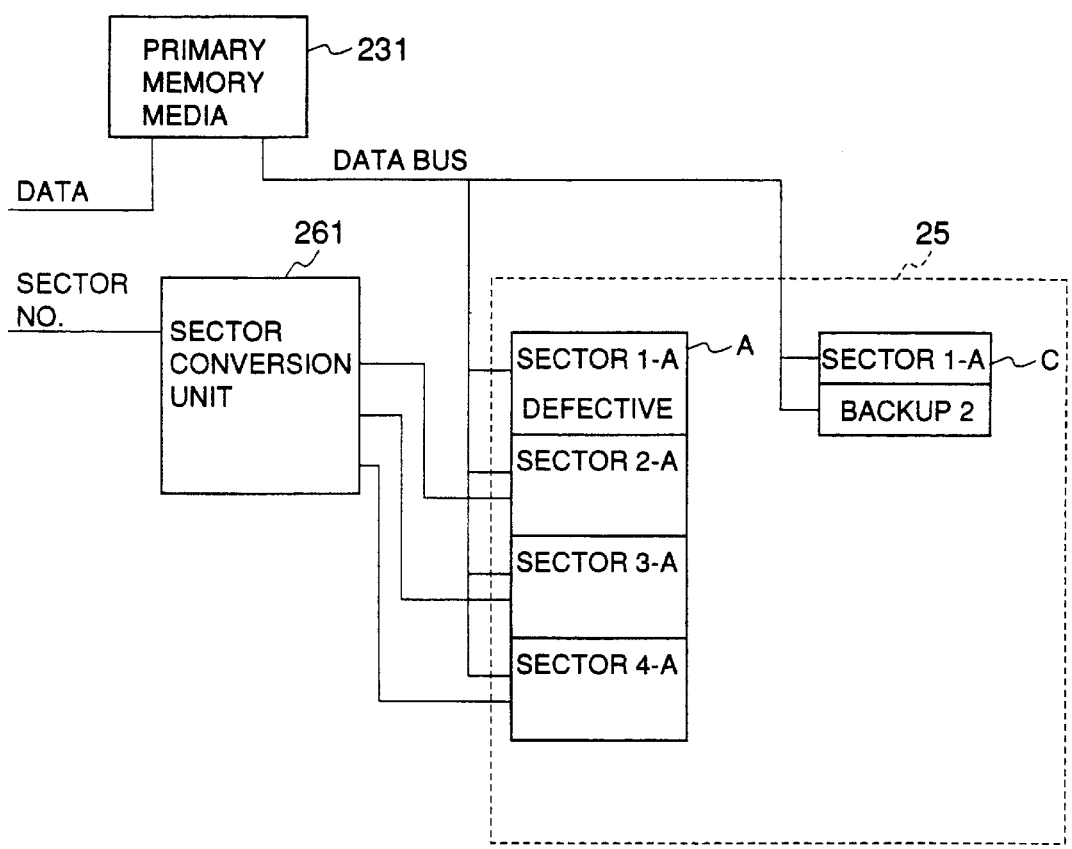

FIGS. 20A and 20B are block diagrams of a system according to a second embodiment. In FIG. 20A, a sector conversion unit 261 includes an EEPROM or other ROM capable of rewrite, e.g., a flash memory. A flash memory 25 includes a first area A and a backup area C. The first area A is provided with four sectors 1 through 4. A primary memory media 23 is the SRAM 23 of FIG. 18 and the like.

In FIG. 20A, while data is being transferred to the primary memory media 231, a check is made on a sector into which the data is to be written. If the sector already has data, the sector is erased. If the transfer of the data is completed before finishing erasing the sector, the system waits until the erasing of the sector is finished. If the transfer of the data is completed after finishing erasing the sector, the data is written upon the end of transfer.

If an error occurs during the writing of the data, the ROM of the sector conversion unit 261 is rewritten, and a sector 1-A is written into the backup area C as shown in FIG. 20B (showing the case that an error occurred in the sector 1-A). Unless there occurs an error in sectors, the backup area C is not used for writing data.

In this embodiment as described above, a sector is erased when it already has data while data to be written is being transferred to the primary memory media 231. Thus, the time lag at the time of writing can be eliminated as in the first embodiment, and a writing speed can be enhanced. Also, since backup areas are provided to substitute for defective sectors, the development of defective sectors is not a problem.

(3) Third Embodiment

Figure 21A:
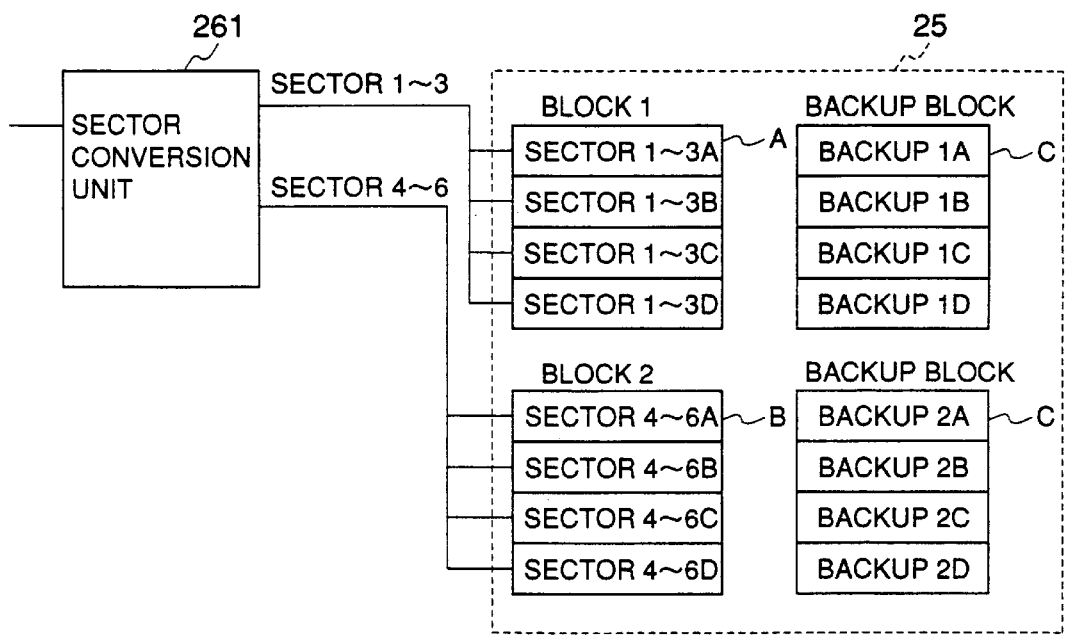
FIGS. 21A and 21B are illustrative drawings showing a third embodiment of enhancing a writing speed according to the present invention.
Figure 21B:
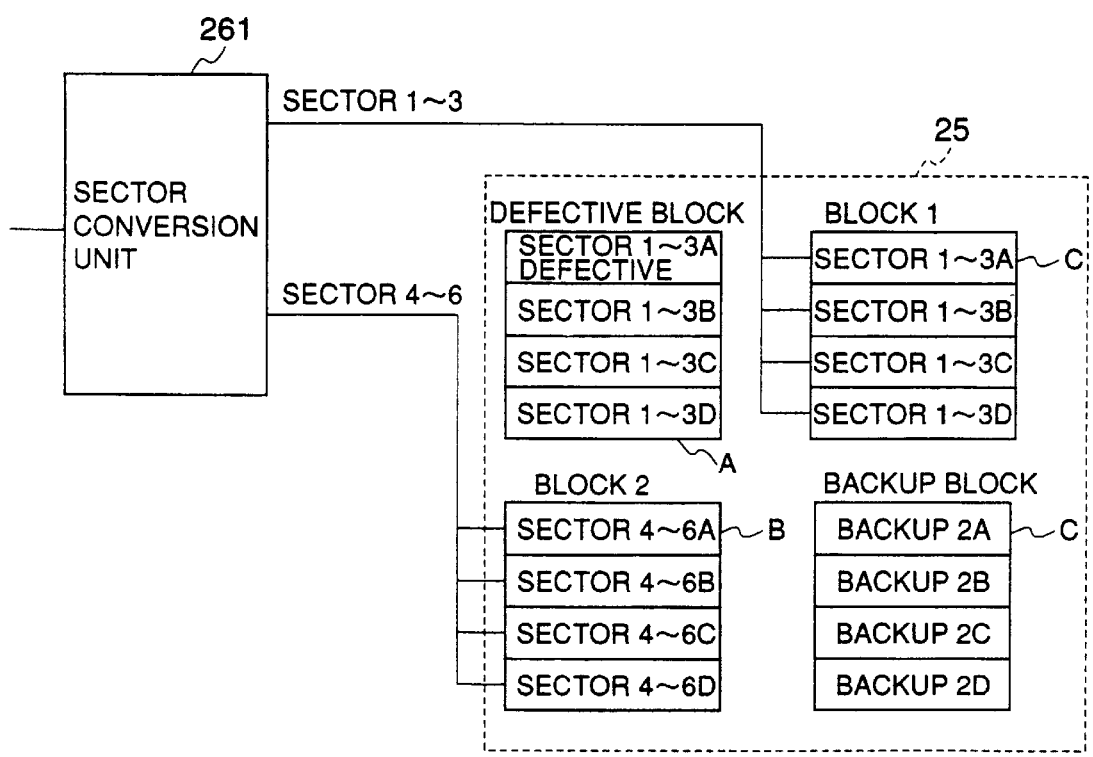

FIGS. 21A and 21B are block diagrams of a system according to a third embodiment. In FIG. 21A, a sector conversion unit 261 includes an EEPROM or other ROM capable of rewrite, e.g., a flash memory. A flash memory includes a block 1, a block 2, a backup block1, and a backup block2. The blocks 1 and 2 are provided with sectors 1-to-3A to 1-to-3D and sectors 4-to-6A to 4-to-6D, respectively.

Each of the sectors 1-to-3A, . . . , and 1-to-3D is one sector having one physical address, and data with a logical address of 1, 2, or 3 can be written into any of those sectors. That is, the four sectors referred to as A to D are provided as areas into which data with a logical address of 1, 2, or 3 is written. When data is written into those sectors, a free area among A to D is used.

The sectors 4-to-6A, . . . , and 4-to-6D are the same as above, and a free area among A to D is used for writing data with a logical address of 4, 5, or 6.

In this embodiment as described above, a memory space is divided into blocks having n+1 sectors (n=3 in this example) so that there is one additional sector in excess of the number of logical addresses.

In FIG. 21A, when writing data with a logical address of 1, the sectors 1-to-3A, . . . , and 1-to-3D are examined to find if a sector of the same logical address already exists. If it does, that sector is erased. Since there is at least one free sector, data is written into a free sector while erasing the above sector.

If an error occurs at the time of writing, one of the backup blocks is used as an alternate block. For example, if the sector 1-to-3A becomes defective, the backup block 1 is assigned to an alternate block as shown in FIG. 21B. At the same time, the ROM of the sector conversion unit 261 is rewritten so as to use the backup block 1 as an alternate for the block 1 suffering an error.

As far as there is a backup block, the process described above is carried out. When the backup blocks are used up, all data are evacuated to an external memory such as the SRAM 23 of FIG. 18, and the ROM of the sector conversion unit 261 is rewritten so as to newly divide the memory space into a data space and a backup space. In doing so, sectors are allocated successively in a descending order or an ascending order of the address depending on the type of the system, with defective sectors being excluded.

The sector conversion unit 261 is structured for converting a logical address into a physical address in such a way that there are n+1 available sectors in one block by making blocks in the unit of n+1 sectors.

When some sectors become defective, the conversion table of the sector conversion unit 261 is rewritten as described above so that there are always n+1 sectors in one block.

In this embodiment as described above, one block has n+1 sectors, i.e., n sectors plus one excess sector, and erasing a sector can be done at the same time as writing data. Thus, the time lag at the time of writing is eliminated to enhance the writing speed. Also, since backup areas are provided to substitute for defective sectors, the development of defective sectors is not a problem.

(4) Fourth Embodiment

Figure 22A:
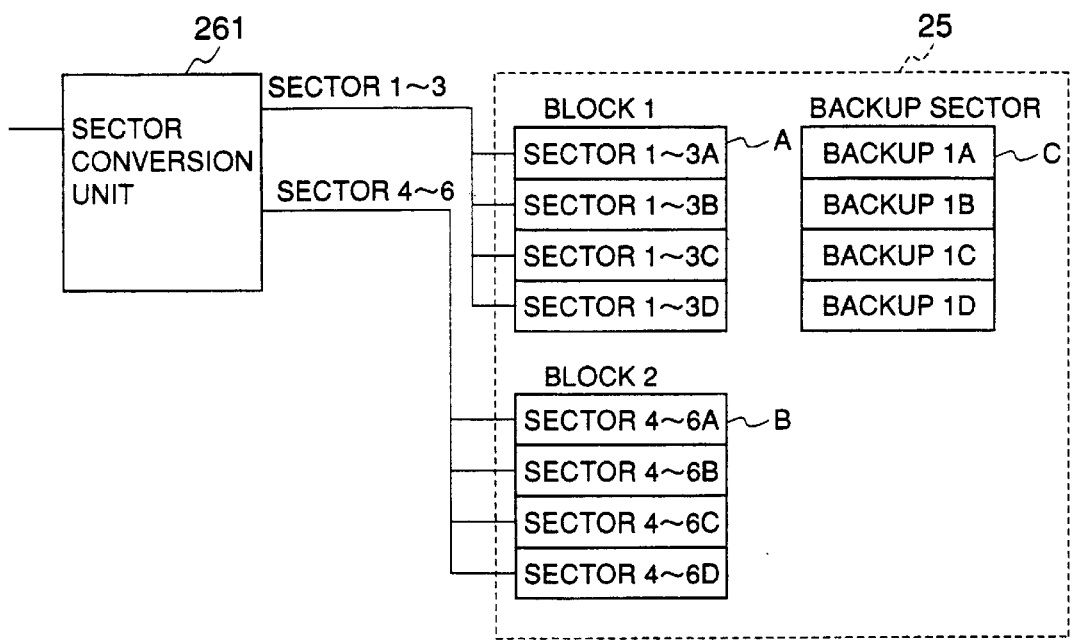
FIGS. 22A and 22B are illustrative drawings showing a fourth embodiment of enhancing a writing speed according to the present invention.
Figure 22B:
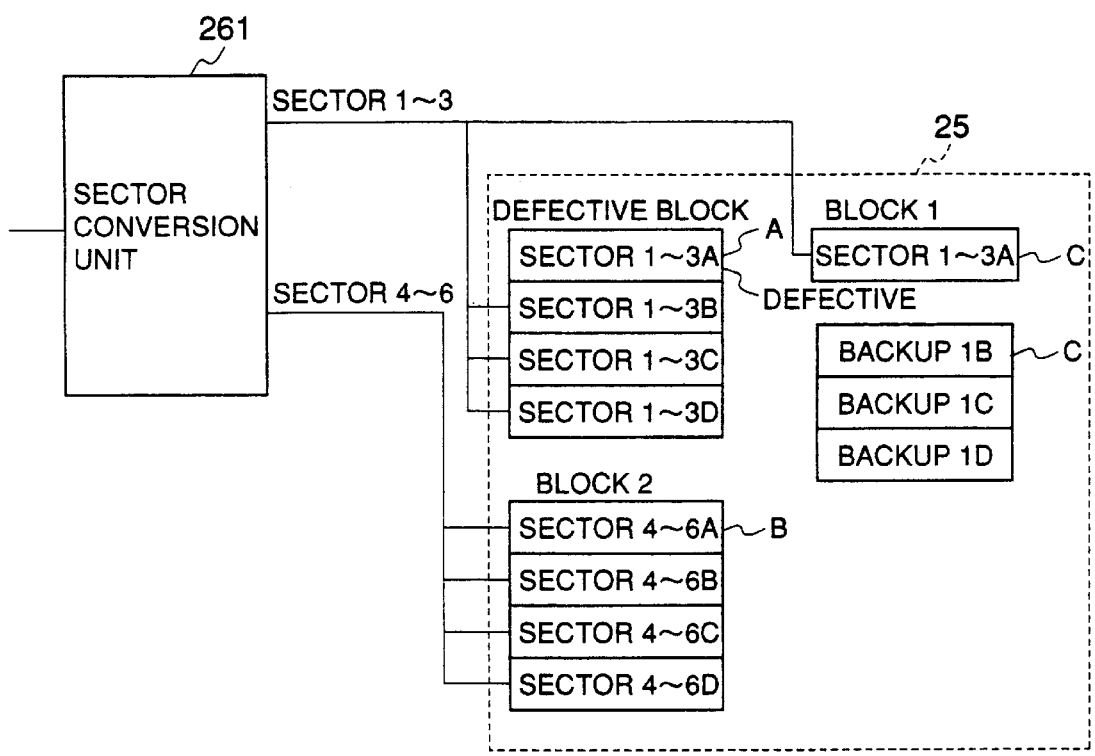

FIGS. 22A and 22B are block diagrams of a system according to a fourth embodiment. In FIG. 22A, a sector conversion unit 261 includes an EEPROM or other ROM capable of rewrite, e.g., a flash memory. A flash memory 25 includes a block 1, a block 2, and backups 1A to 1D. The blocks 1 and 2 are provided with sectors 1-to-3A to 1-to-3D and sectors 4-to-6A to 4-to-6D, respectively.

In this embodiment, there are n+1 sectors (n=3 in this example) in one block as in the third embodiment so that there is at least one free sector at anytime.

In FIG. 22A, when writing data with a logical address of 1, the sectors 1-to-3A, . . . , and 1-to-3D are examined to find if a sector of the same logical address already exists. If it does, that sector is erased. Since there is at least one free sector, data is written into a free sector while erasing the above sector.

If an error occurs at the time of writing, one of the backups 1A to 1D is used as an alternate sector. For example, if the sector 1-to-3A becomes defective, the backup 1A is newly included in the block 1 as shown in FIG. 22B. At the same time, the ROM of the sector conversion unit 261 is rewritten so as to use the backup 1A as an alternate for the sector 1-to-3A. Thus, the backup 1A becomes a sector 1-to-3A while leaving the backups 1B to 1D for further use.

As far as there is a backup, the process described above is carried out. When the backups are used up, all data are evacuated to an external memory such as the SRAM 23 of FIG. 18, and the ROM of the sector conversion unit 261 is rewritten so that the memory space is newly divided into a data space and a backup space. In doing so, sectors are allocated successively in a descending order or an ascending order of the address depending on the type of the system, with defective sectors being excluded.

The sector conversion unit 261 has an address conversion table for converting a logical address-into a physical address such that there are n+1 sectors available for writing one sector by making blocks in the unit of n+1 sectors. When some sectors become defective, the conversion table of the sector conversion unit 261 is rewritten so that there are always n+1 sectors in one block.

In this embodiment as described above, one block has n+1 sectors, i.e., n sectors plus one excess sector, and erasing a sector can be done at the same time as writing data. Thus, same as the first, second, and third embodiments, the time lag at the time of writing is eliminated to enhance a writing speed. Also, since backup areas are provided to substitute for defective sectors, the development of defective sectors is not a problem.

(5) Fifth Embodiment

Figure 23A:
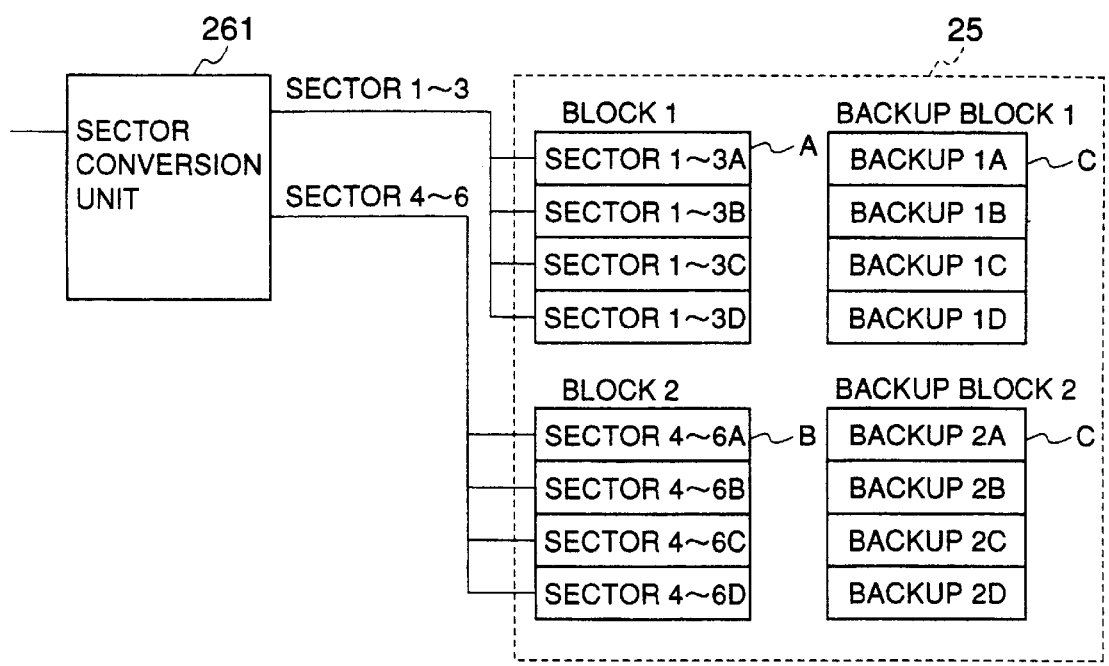
FIGS. 23A and 23B are illustrative drawings showing a fifth embodiment of enhancing a writing speed according to the present invention.
Figure 23B:
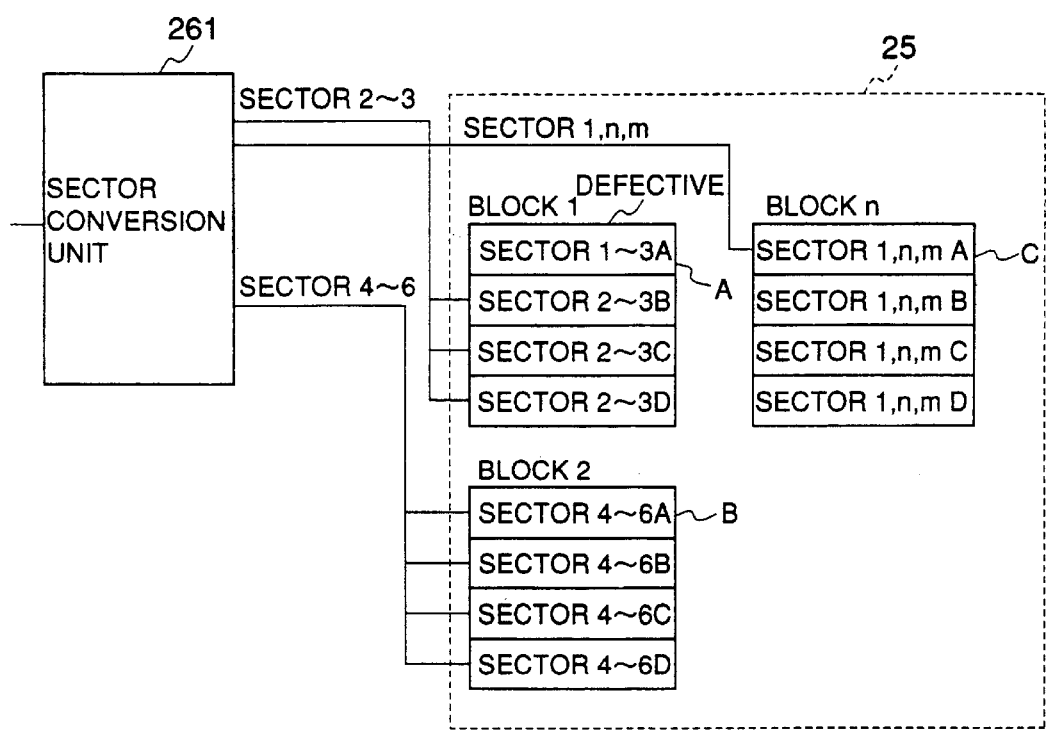

FIGS. 23A and 23B are block diagrams of a system according to a fifth embodiment. In FIGS. 23A and 23B, which have the same references as do FIGS. 22A and 22B for the same elements, a sector conversion unit includes an EEPROM or other ROM capable of rewrite, e.g., a flash memory. A flash memory 25 includes a block 1, a block 2, a backup block 1, and a backup block 2. The blocks 1 and 2 are provided with sectors 1-to-3A to 1-to-3D and sectors 4-to-6A to 4-to-6D, respectively.

In this embodiment, there are n+1 sectors (n=3 in this example) in one block as in the third embodiment so that there is at least one free sector at anytime.

In FIG. 23A, when writing data with a logical address of 1, the sectors 1-to-3A, . . . , and 1-to-3D are examined to determine if a sector of the same logical address already exists. If it does, that sector is erased. Since there is at least one free sector, data is written into a free sector while erasing the above sector.

If an error occurs at the time of writing, one of the backup sectors is used as an alternate sector. For example, if the sector 1-to-3A becomes defective, the ROM of the sector conversion unit 261 is rewritten so as to use one of the sectors of the backup block 1 as an alternate for the sector 1-to-3A. In doing so, the backup block 1 is assigned to a block n in a memory space. As shown in FIG. 23B, a sector 1, n, mA of the block n becomes a sector 1, i.e., the sector 1 is included in the block n while leaving the sectors 2 and 3 in the block 1.

In other words, a block need not have sectors of successive addresses, and the number of sectors in a block is changed when there is a defective sector.

As long as there is a backup, the process described above is carried out. When the backups are used up, all data are evacuated to an external memory such as the SRAM 23 of FIG. 18, and the ROM of the sector conversion unit 261 is rewritten so that the memory space is newly divided into a data space and a backup space. In doing so, sectors are allocated successively in a descending order or an ascending order of the address depending on the type of the system, with defective sectors being excluded.

In this embodiment, as described above, one block has n+1 sectors, i.e., n sectors plus one excess sector, and erasing a sector can be done at the same time as writing data. Thus, same as the first, second, third, and fourth embodiments, the time lag at the time of writing is eliminated to enhance the writing speed. Also, since backup areas are provided to substitute for defective sectors, the development of defective sectors is not a problem.

Figure 24A:
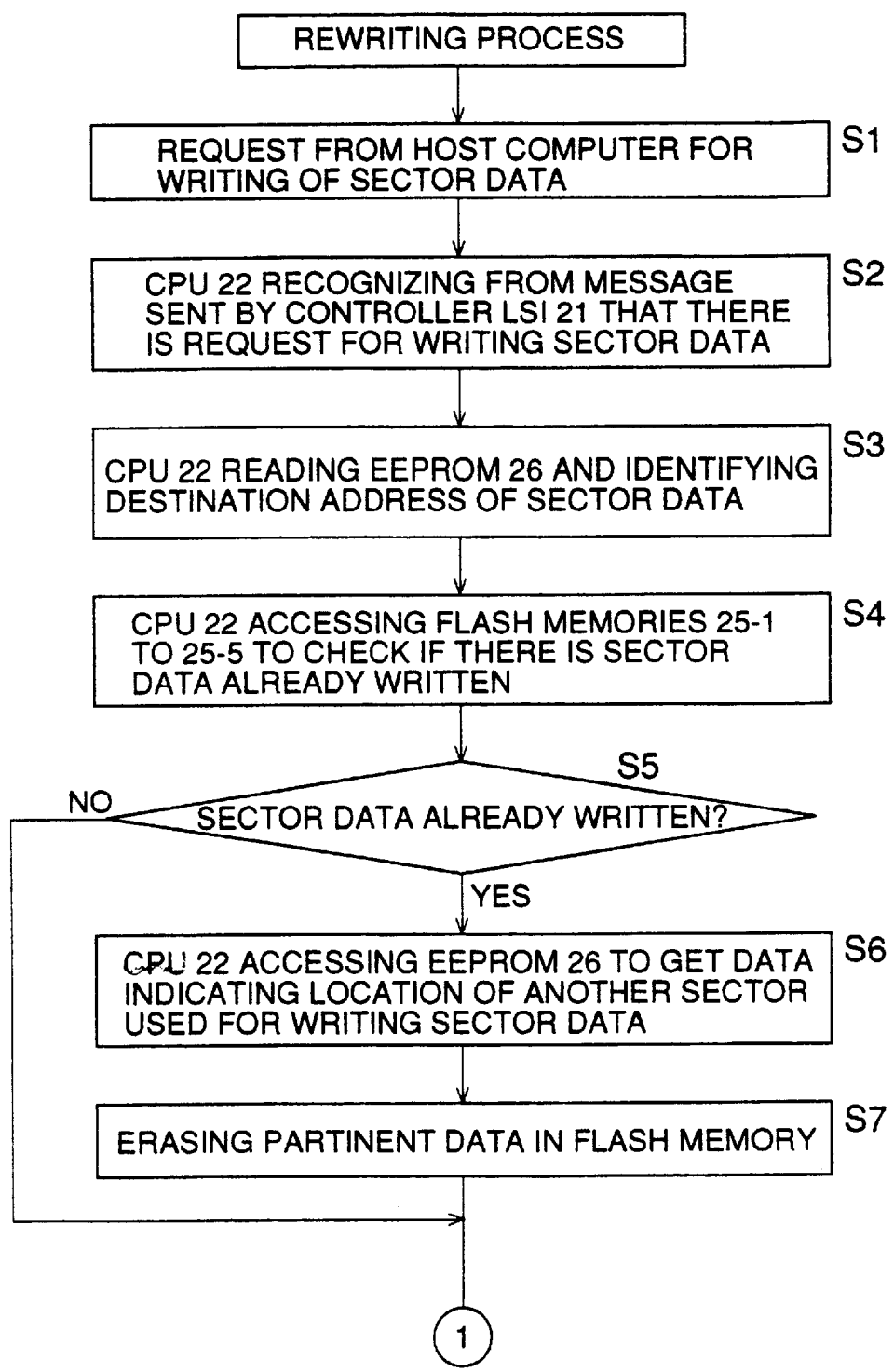
FIGS. 24A to 24C are a flow chart showing a process of enhancing a writing speed.
Figure 24B:
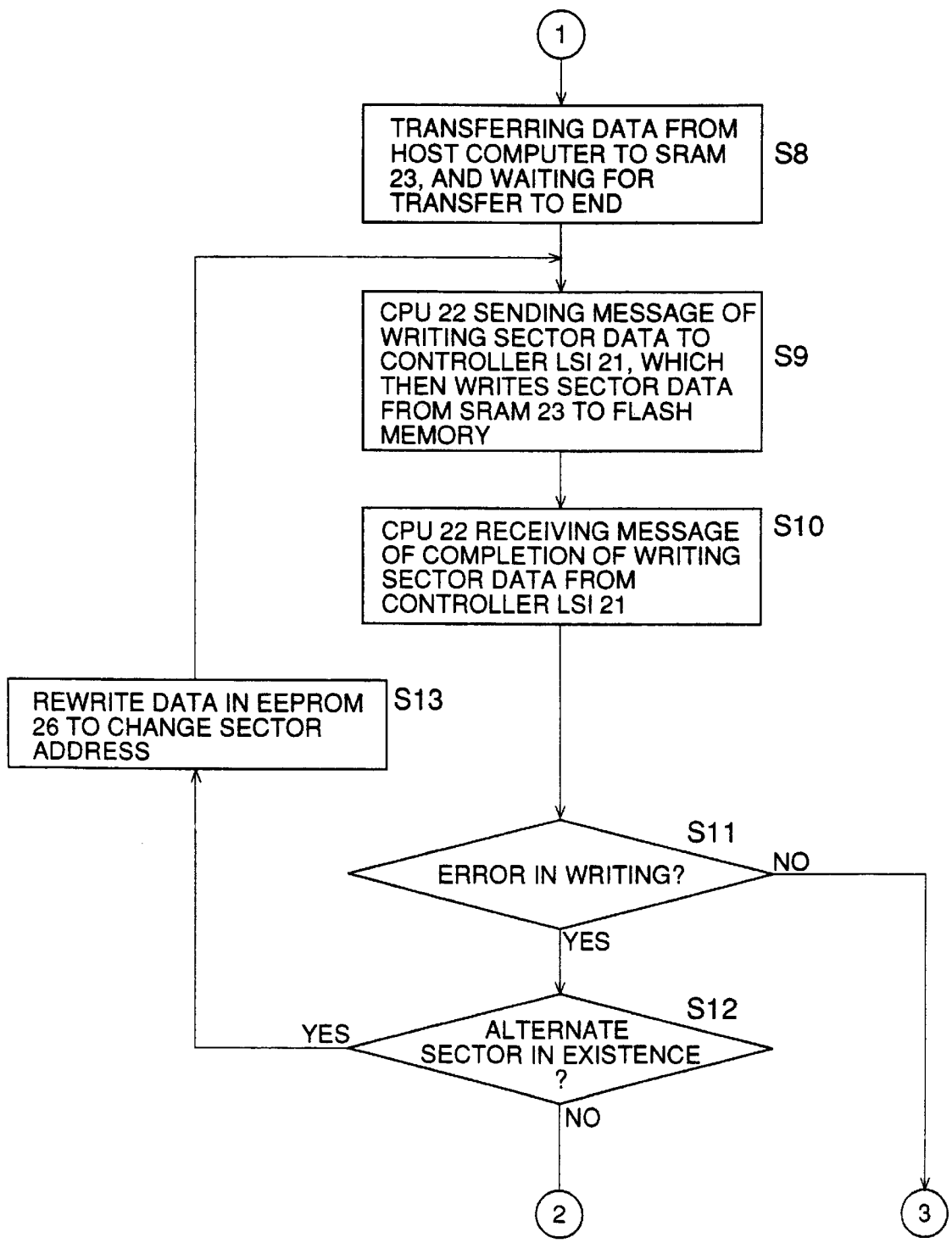
Figure 24C:
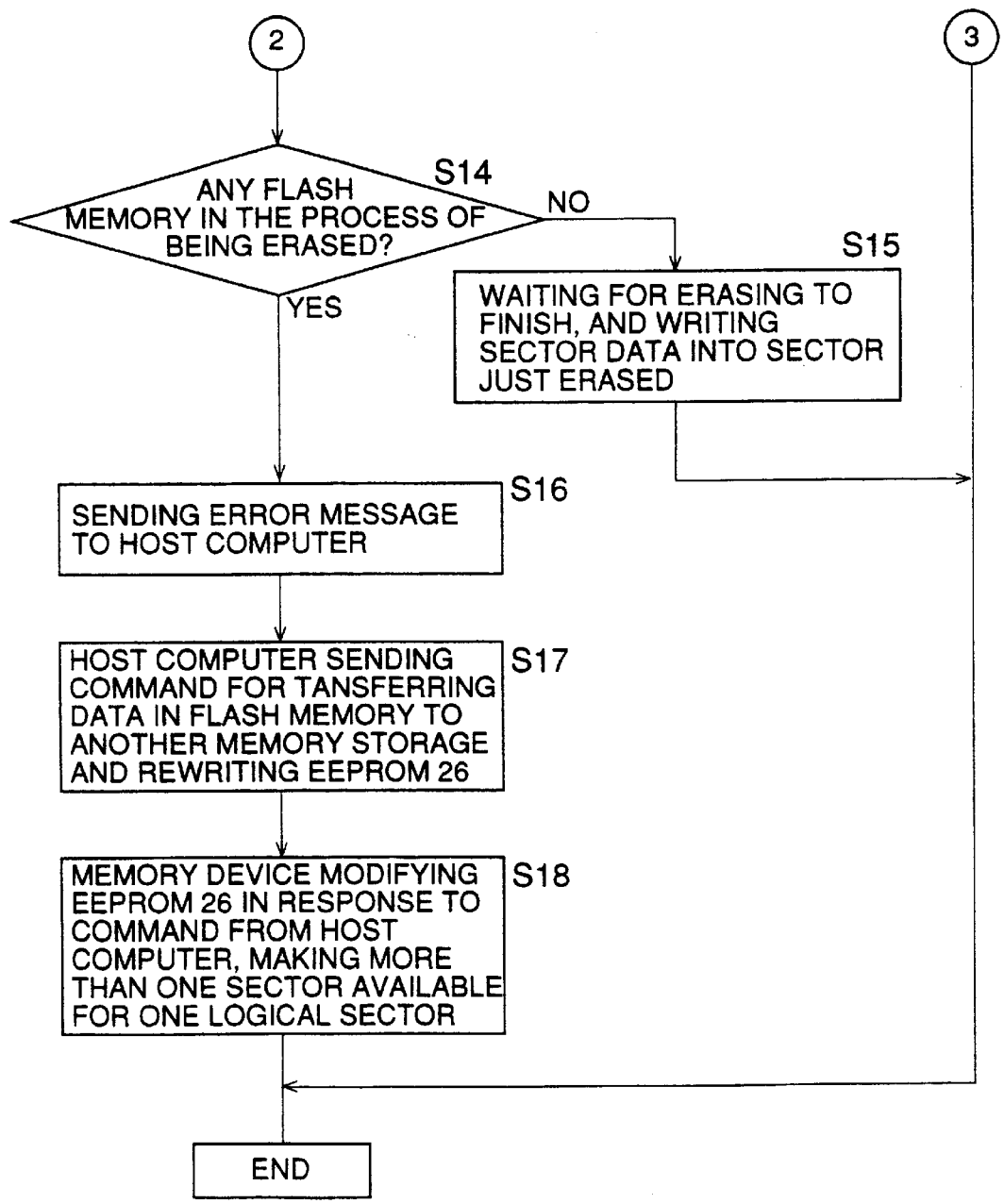

FIGS. 24A to 24C show a flow chart of a process common in all the above embodiments. With reference to FIGS. 24A to 24C, a process of the embodiments shown in FIG. 18 will be described below.

At a step S1, a host computer requests the writing of sector data. At a step S2, the CPU 22 of FIG. 18 recognizes from the message sent by the controller LSI 21 that there is a request for the writing of sector data. Here, it may be instead that the controller LSI 21 interrupts the CPU 22 to send thereto a request for the writing of sector data.

At a step S3, the CPU 22 reads the EEPROM 26, and identifies the destination address of the sector data. Also, the CPU 22 accesses the flash memories 25-1 to 25-5 to look up management information and that sort in order to check if there is sector data already written. At a step S5, a check is made whether there is sector data already written, and if there is not, go to a step S8 of FIG. 24B. If there is sector data already written, the CPU 22 accesses the EEPROM 26 at a step S6 to get data indicating the location of another sector used for writing the sector data. Then, at a step S7, pertinent data in the flash memories is erased (an error check is performed later for a process efficiency), and the step S8 of FIG. 24B is the next step to proceed.

At a step S8, data is transferred from a host computer to the SRAM 23, and proceeding to the next step waits until the completion of the data transfer. At a step S9, the CPU 22 sends a message of the writing of the sector data to the controller LSI 21, so that the controller writes the sector data into the flash memories. At a step S10, the CPU 22 receives a message of the completion of the writing of the sector data from the controller LSI 21. At a step S11, a check is made whether an error occurred in writing the sector data.

If no error occurred, this is the end of the process. If an error occurred, a check is made at a step S12 to determine whether there is an alternate sector. If there is, go to a step S13, where data in the EEPROM 26 is rewritten to change the sector address. Then, go back to the step S9.

If there is no alternate sector, go to a step S14 of FIG. 24C, where a check is made whether there is a flash memory in the process of being erased at that moment of time. If there is, go to a step S15, where the sector data, after waiting until the completion of erasing, is written into a sector which has been just erased. This is the end of the process.

If no flash memories turns out to be in the process of being erased at a step S14, an error message is sent to the host computer at a step S16.

Then, at a step S17, the host computer send a command for transferring data in the flash memories into another memory storage and rewriting the EEPROM 26. The memory device 20 modifies the EEPROM 26 in response to the command from the host computer in such a way that more than one sector is available for one logical sector sent from the host computer. By doing this, the memory device 20 can be used again, although it has a less memory volume.

In the above, a process has been described for the case that data is transferred to the SRAM 23 and, then, written into the flash memories. However, it is also possible for data to be written directly into the flash memories without having the SRAM 23 provided (in this case, the steps S8 and S9 become one step in the flow chart described above).

Further, the present invention is not limited to these embodiments, but various variations and modifications may be made without departing from the scooe of the present invention.

What is claimed is:

1. A management method of writing data in a memory device with a memory area having a plurality of sectors unable to be overwritten, said memory device erasing data by the unit of one sector, said method comprising the steps of;

transferring to a primary memory storage first data to be written into one of the sectors;

erasing second data in said one of the sectors at the same time as said step of transferring; and writing said first data into said one of the sectors after finishing both said step of transferring and said step of erasing.

2. The management method as claimed in claim 1, further comprising a step of rewriting a decode table for managing said sectors when at least one defective sector is generated, said decode table being rewritten so that a sector in a backup area is used by replacing said defective sector.

3. The management method as claimed in claim 2, further comprising a step of reconstructing an arrangement of said sectors by rewriting a decode table for managing said sectors when said backup area becomes unusable.

* * * * *